United States Patent
Shim et al.

(10) Patent No.: US 10,199,319 B2
(45) Date of Patent: Feb. 5, 2019

(54) PRINTED CIRCUIT BOARD AND SEMICONDUCTOR PACKAGE INCLUDING THE SAME

(71) Applicant: SAMSUNG ELECTRONICS CO., LTD., Suwon-si, Gyeonggi-do (KR)

(72) Inventors: Jong-Bo Shim, Asan-si (KR); Sang-Uk Han, Hwaseong-si (KR); Yun-Seok Choi, Hwaseong-si (KR); Ji-Hwang Kim, Cheonan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 2 days.

(21) Appl. No.: 15/485,794

(22) Filed: Apr. 12, 2017

(65) Prior Publication Data
US 2018/0040549 A1 Feb. 8, 2018

(30) Foreign Application Priority Data
Aug. 8, 2016 (KR) .......................... 10-2016-0100884

(51) Int. Cl.
H01L 23/00 (2006.01)
H01L 23/31 (2006.01)
H01L 23/498 (2006.01)
H01L 25/065 (2006.01)

(52) U.S. Cl.
CPC .... H01L 23/49838 (2013.01); H01L 23/3114 (2013.01); H01L 23/3185 (2013.01); H01L 23/49822 (2013.01); H01L 24/16 (2013.01); H01L 25/0655 (2013.01); *H01L 2224/16157* (2013.01)

(58) Field of Classification Search
None
See application file for complete search history.

(56) References Cited

U.S. PATENT DOCUMENTS

| 5,185,550 | A | * | 2/1993 | Morita | ...................... | H03H 3/02 |
| | | | | | | 310/344 |
| 6,919,230 | B2 | * | 7/2005 | Chiu | ....................... | H01L 24/83 |
| | | | | | | 257/783 |
| 7,402,901 | B2 | | 7/2008 | Hatano et al. | | |
| 7,892,882 | B2 | * | 2/2011 | Leal | ......................... | H01L 23/36 |
| | | | | | | 257/678 |
| 8,003,438 | B2 | | 8/2011 | Morimoto et al. | | |

(Continued)

FOREIGN PATENT DOCUMENTS

| JP | 2013-051432 | 3/2013 |
| JP | 2016-051726 | 4/2016 |
| KR | 10-0650707 | 11/2006 |

*Primary Examiner* — David E Graybill
(74) *Attorney, Agent, or Firm* — F. Chau & Associates, LLC

(57) ABSTRACT

A printed circuit board (PCB) includes a substrate base including at least two chip attach regions spaced apart from one another, a plurality of upper pads disposed in the at least two chip attach regions of the substrate base, an accommodation cavity overlapping a part of each of the at least two chip attach regions and recessed in an upper surface of the substrate base, and at least one spacing groove recessed in the upper surface of the substrate base. The at least one spacing groove is connected to the accommodation cavity, and extends in a region between the at least two chip attach regions.

12 Claims, 26 Drawing Sheets

(56) References Cited

U.S. PATENT DOCUMENTS

| | | |
|---|---|---|
| 8,064,224 B2 | 11/2011 | Mahajan et al. |
| 8,288,854 B2 * | 10/2012 | Weng .................... H01L 23/13 |
| | | 257/678 |
| 8,373,997 B2 | 2/2013 | Kobayashi et al. |
| 8,872,349 B2 | 10/2014 | Chiu et al. |
| 9,059,067 B2 | 6/2015 | Choi et al. |
| 9,171,816 B2 * | 10/2015 | Teh ........................ H01L 24/19 |
| 9,236,366 B2 * | 1/2016 | Roy ........................ H01L 23/13 |
| 9,349,703 B2 * | 5/2016 | Chiu ...................... H01L 24/23 |
| 9,553,078 B2 * | 1/2017 | Eichenberg ......... H01L 25/0753 |
| 9,894,771 B2 * | 2/2018 | Fjelstad .............. B32B 37/153 |
| 9,997,446 B2 * | 6/2018 | Kim ................. H01L 23/49838 |
| 2006/0226527 A1 * | 10/2006 | Hatano .............. H01L 23/5389 |
| | | 257/686 |
| 2007/0284704 A1 * | 12/2007 | Leal ...................... H01L 23/36 |
| | | 257/666 |
| 2008/0090335 A1 * | 4/2008 | Morimoto ........... H01L 23/5389 |
| | | 438/118 |
| 2009/0244874 A1 * | 10/2009 | Mahajan .................. H01L 24/16 |
| | | 361/809 |
| 2011/0156228 A1 * | 6/2011 | Kobayashi .......... H01L 23/3677 |
| | | 257/676 |
| 2011/0285006 A1 * | 11/2011 | Weng .................... H01L 23/13 |
| | | 257/686 |
| 2011/0315302 A1 * | 12/2011 | Fjelstad ................ B32B 37/153 |
| | | 156/87 |
| 2012/0091468 A1 * | 4/2012 | Choi ..................... H01L 21/486 |
| | | 257/77 |
| 2013/0161836 A1 * | 6/2013 | Yeom .................... H01L 25/105 |
| | | 257/778 |
| 2014/0070380 A1 * | 3/2014 | Chiu .................... H01L 23/5381 |
| | | 257/666 |
| 2015/0228630 A1 * | 8/2015 | Eichenberg ......... H01L 25/0753 |
| | | 362/545 |
| 2016/0071818 A1 * | 3/2016 | Wang .................. H01L 25/0655 |
| | | 257/774 |
| 2017/0005042 A1 * | 1/2017 | Chen ..................... H01L 23/552 |
| 2018/0040548 A1 * | 2/2018 | Kim ................. H01L 23/49838 |
| 2018/0040549 A1 * | 2/2018 | Shim ................. H01L 23/49838 |

* cited by examiner

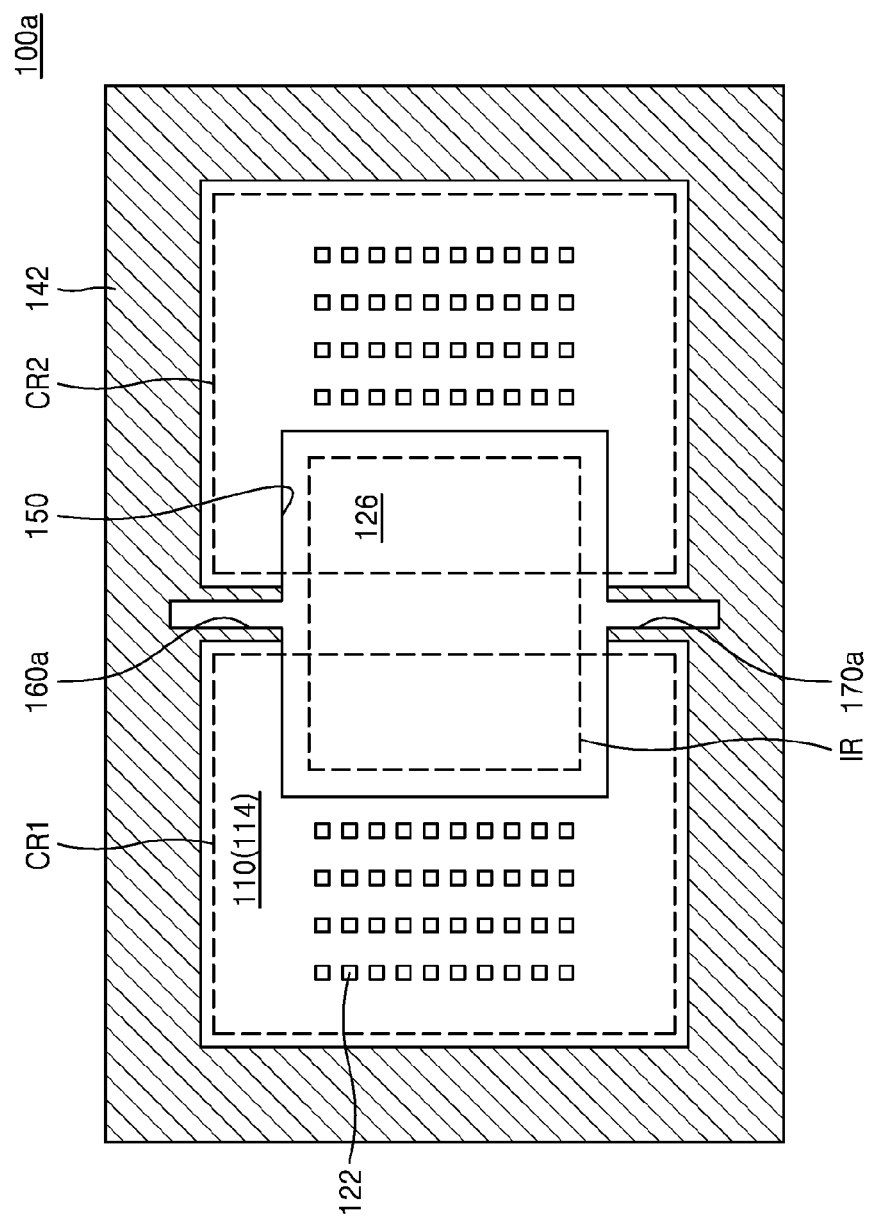

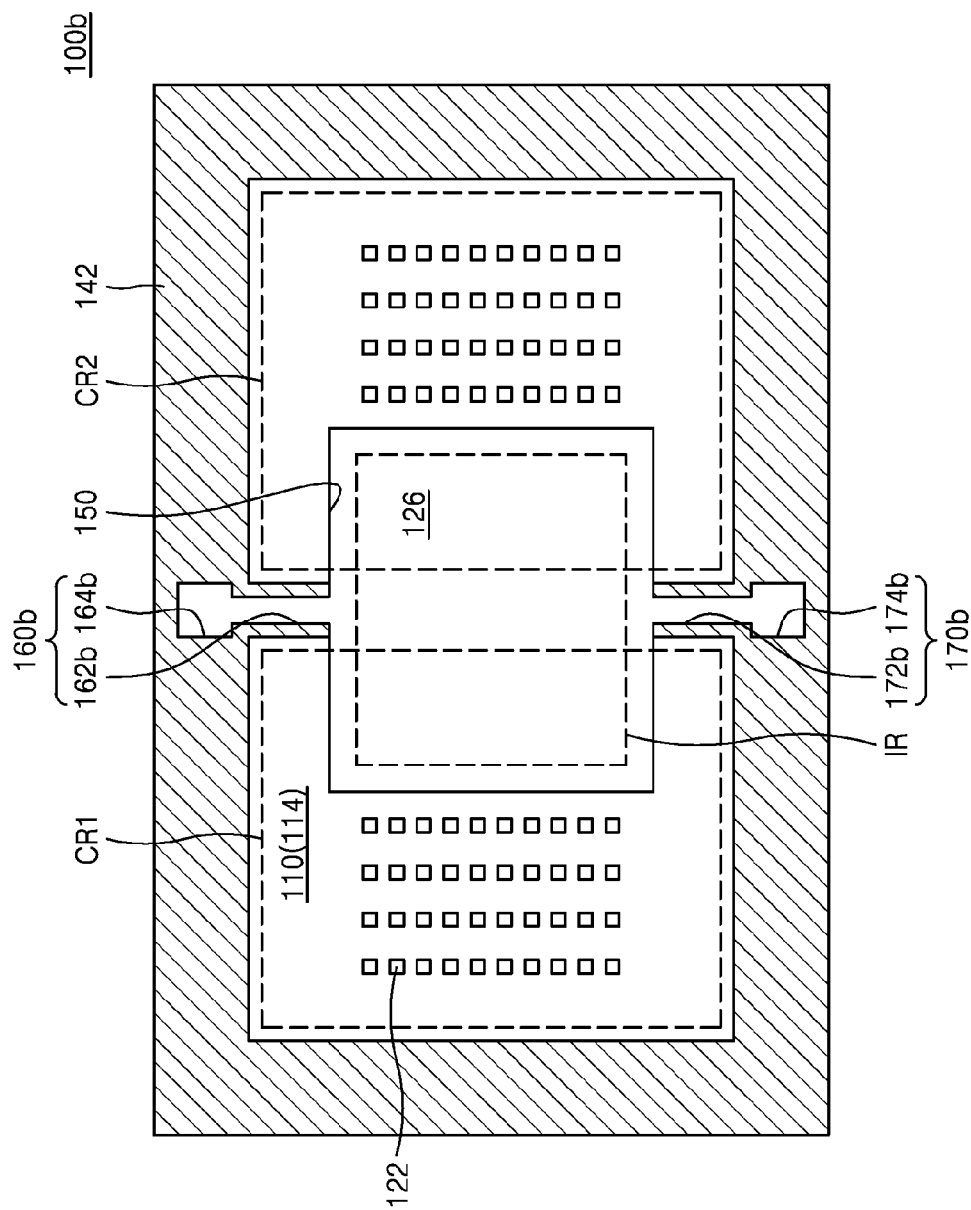

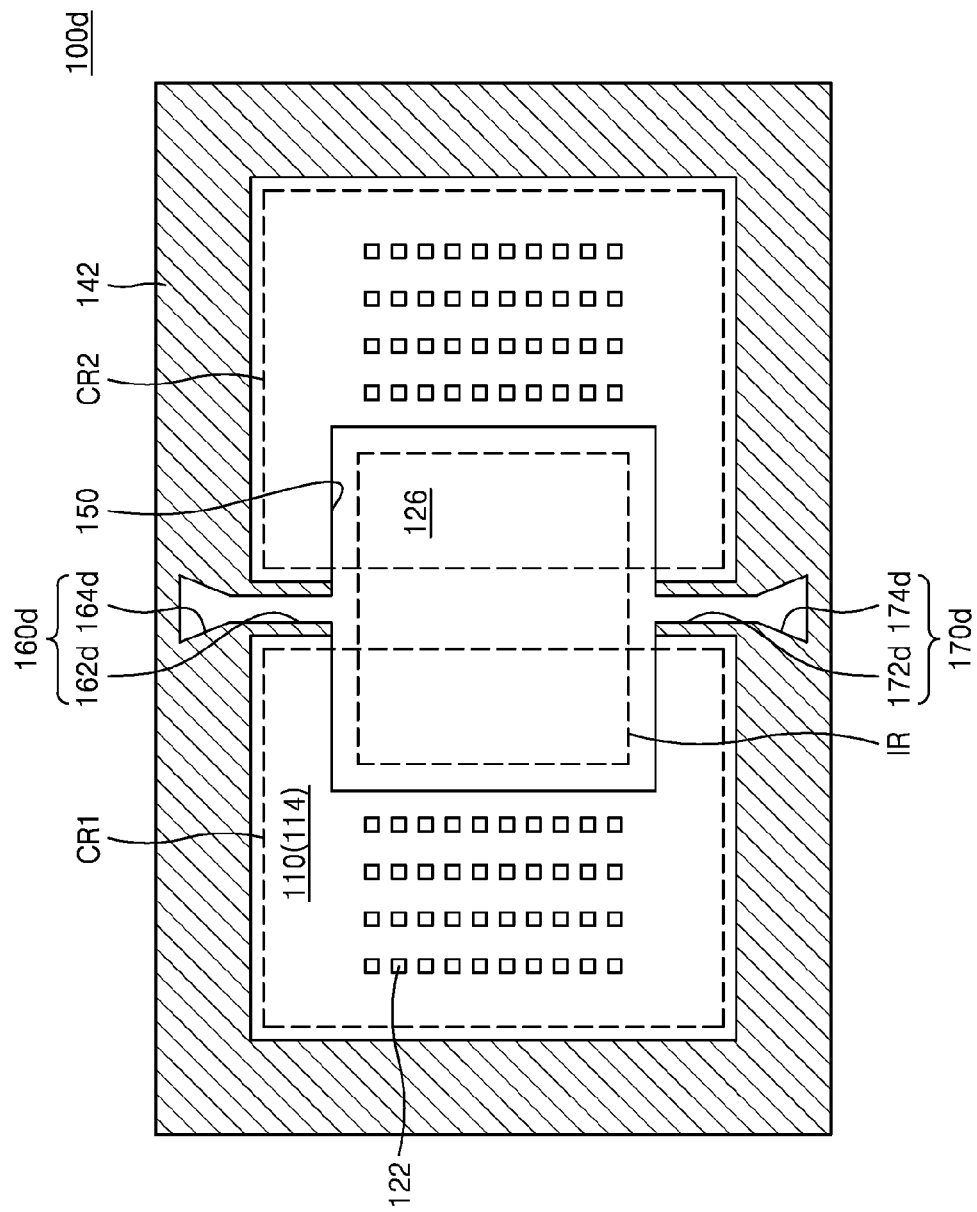

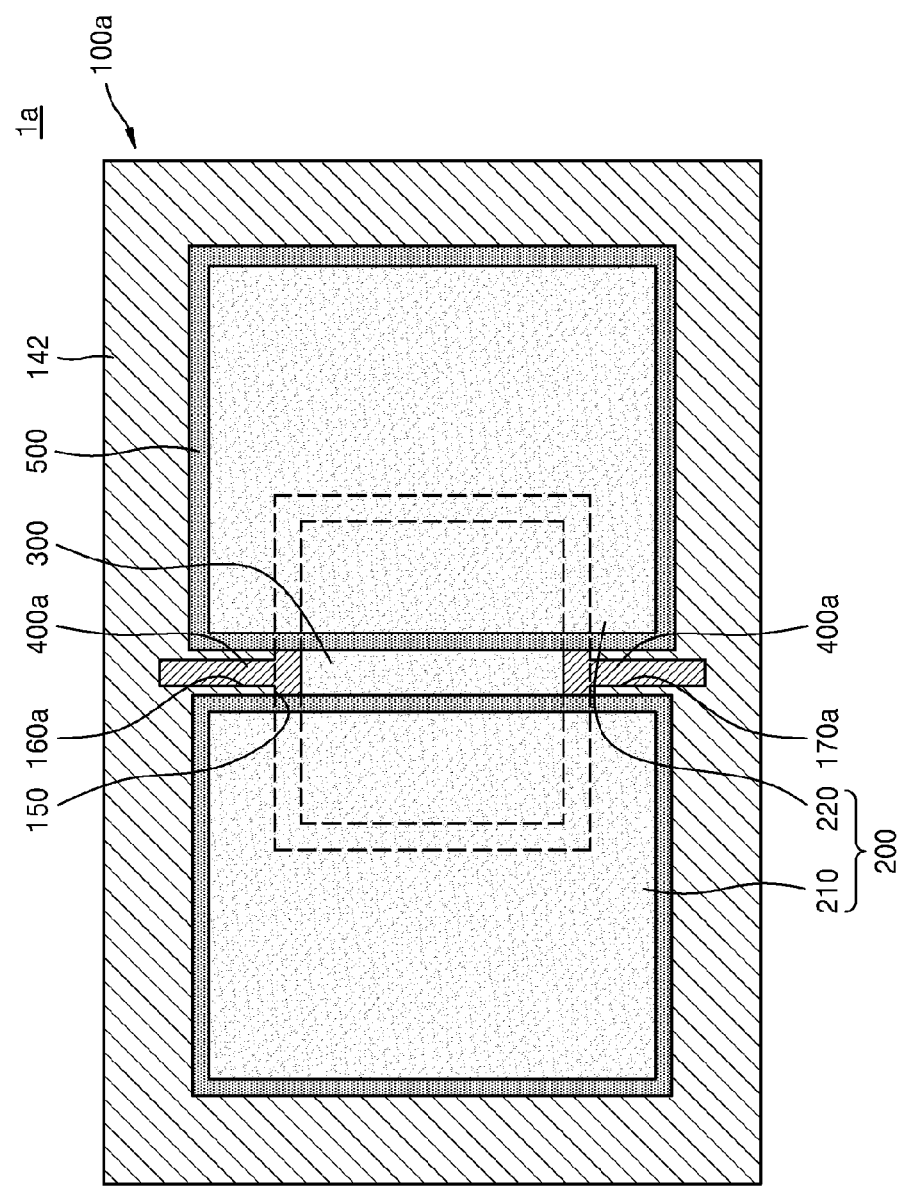

US 10,199,319 B2

PRINTED CIRCUIT BOARD AND SEMICONDUCTOR PACKAGE INCLUDING THE SAME

CROSS-REFERENCE TO RELATED APPLICATIONS

This application claims priority to Korean Patent Application No. 10-2016-0100884, filed on Aug. 8, 2016, the disclosure of which is incorporated by reference herein in its entirety.

TECHNICAL FIELD

Exemplary embodiments of the inventive concept relate to a printed circuit board (PCB) and a semiconductor package including the PCB, and more particularly, to a PCB for mounting a plurality of semiconductor chips, the plurality of semiconductor chips, and a semiconductor package including the PCB.

DISCUSSION OF THE RELATED ART

As the demand for various electronic devices increases, it is desirable for electronic devices to have smaller sizes, multiple functions, and higher capacity. Thus, high capacity semiconductor chips and multi-functional semiconductor chips are being used more frequently. To provide reliable interconnections between high capacity semiconductor chips and multi-functional semiconductor chips, a semiconductor package including a plurality of semiconductor chips is utilized.

SUMMARY

According to an exemplary embodiment of the inventive concept, a printed circuit board (PCB) includes a substrate base including at least two chip attach regions spaced apart from one another, a plurality of upper pads disposed in the at least two chip attach regions of the substrate base, an accommodation cavity overlapping a part of each of the at least two chip attach regions and recessed in an upper surface of the substrate base, and at least one spacing groove recessed in the upper surface of the substrate base. The at least one spacing groove is connected to the accommodation cavity, and extends in a region between the at least two chip attach regions.

According to an exemplary embodiment of the inventive concept, a semiconductor package includes a printed circuit board (PCB) including a substrate base, a plurality of upper pads disposed on an upper surface of the substrate base, an accommodation cavity recessed in the upper surface of the substrate base, and at least one spacing groove recessed in the upper surface of the substrate base. The at least one spacing groove is connected to the accommodation cavity and extends from the accommodation cavity. The semiconductor package further includes a wiring interposer disposed in the accommodation cavity. The wiring interposer includes an interposer substrate and a plurality of connection pads disposed on the interposer substrate. The semiconductor package further includes a first semiconductor chip and a second semiconductor chip attached to the PCB and spaced apart from each other. The first semiconductor chip and the second semiconductor chip include connection terminals connected to the plurality of upper pads and the plurality of connection pads. The semiconductor package further includes an adhesion material layer disposed in the accommodation cavity and at least a part of the at least one spacing groove. The adhesion material layer is disposed between the wiring interposer and side surfaces of the accommodation cavity, and between the wiring interposer and a lower surface of the accommodation cavity. The upper surface of the substrate base, an upper surface of the interposer substrate, and an upper surface of the adhesion material layer are substantially aligned with one another at a same level.

According to an exemplary embodiment of the inventive concept, a semiconductor package includes a printed circuit board (PCB) including a substrate base, a plurality of upper pads disposed on an upper surface of the substrate base, a plurality of accommodation cavities recessed in the upper surface of the substrate base, and at least one spacing groove recessed in the upper surface of the substrate base. The at least one spacing groove is connected to the plurality of accommodation cavities and extends from the plurality of accommodation cavities. The semiconductor package further includes a plurality of wiring interposers disposed in the plurality of accommodation cavities, each of the wiring interposers including an interposer substrate and a plurality of connection pads disposed on the interposer substrate. The semiconductor package further includes a first semiconductor chip and a plurality of second semiconductor chips attached to the PCB and spaced apart from one another. Each of the first semiconductor chip and the second semiconductor chips includes connection terminals connected to the plurality of upper pads and the plurality of connection pads. The semiconductor package further includes an adhesion material layer disposed in the plurality of accommodation cavities and at least a part of the at least one spacing groove. The adhesion material layer is disposed between the plurality of wiring interposers and side surfaces of the plurality of accommodation cavities, and between the plurality of wiring interposers and lower surfaces of the plurality of accommodation cavities. The upper surface of the substrate base, an upper surface of the interposer substrate, and an upper surface of the adhesion material layer are substantially aligned with one another at a same level below a lower surface of each of the first semiconductor chip and the plurality of second semiconductor chips. At least two of the plurality of second semiconductor chips are spaced apart from one another at one side of the first semiconductor chip.

According to an exemplary embodiment of the inventive concept, a semiconductor package includes a printed circuit board (PCB) including a substrate base, a plurality of upper pads disposed on an upper surface of the substrate base, an accommodation cavity recessed in the upper surface of the substrate base, and at least one spacing groove recessed in the upper surface of the substrate base. The at least one spacing groove is connected to the accommodation cavity. The semiconductor package further includes a wiring interposer disposed in the accommodation cavity. The wiring interposer includes an interposer substrate and a plurality of connection pads disposed on the interposer substrate. The semiconductor package further includes a first semiconductor chip and a second semiconductor chip attached to the PCB and spaced apart from each other. The first semiconductor chip and the second semiconductor chip include connection terminals connected to the plurality of upper pads and the plurality of connection pads. The semiconductor package further includes an adhesion material layer filling the accommodation cavity and at least a part of the at least one spacing groove. The adhesion material layer surrounds side surfaces of the wiring interposer and a bottom surface of the wiring interposer. The upper surface of the substrate base, an upper surface of the interposer substrate, and an upper surface of the adhesion material layer are disposed at a same level as one another.

BRIEF DESCRIPTION OF THE DRAWINGS

The above and other features of the inventive concept will become more apparent by describing in detail exemplary embodiments thereof with reference to the accompanying drawings, in which:

FIGS. 2A through 2D are plan views of PCBs according to exemplary embodiments of the inventive concept.

FIG. 5 is a plan layout view of a semiconductor package according to an exemplary embodiment of the inventive concept.

DETAILED DESCRIPTION OF THE EXEMPLARY EMBODIMENTS

Figure 1A:
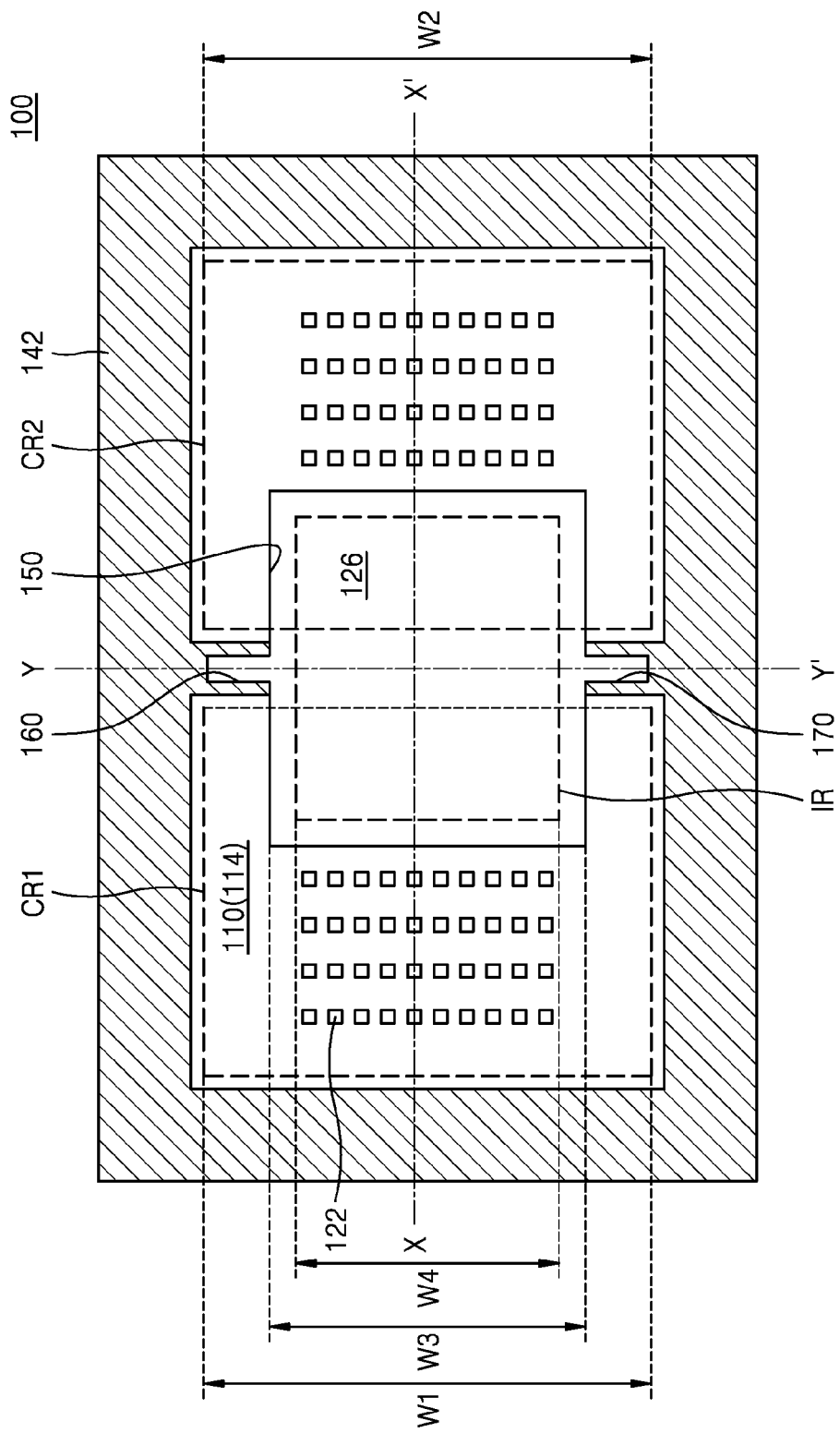
FIGS. 1A through 1C are plan views and cross-sectional views of a printed circuit board (PCB) according to an exemplar embodiment of the inventive concept.

Exemplary embodiments of the present inventive concept will be described more fully hereinafter with reference to the accompanying drawings. Like reference numerals may refer to like elements throughout the accompanying drawings.

Spatially relative terms, such as "beneath", "below", "lower", "under", "above", "upper", "top", "bottom", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when two or more elements or values are described as being substantially the same as or about equal to each other, it is to be understood that the elements or values are identical to each other, indistinguishable from each other, or distinguishable from each other but function-ally the same as each other as would be understood by a person having ordinary skill in the art. Similarly, when two or more elements are describes as being substantially aligned with one another, it is to be understood that the elements are exactly aligned with one another or almost aligned with one another (e.g., within a measurement error) as would be understood by a person having ordinary skill in the art. Similarly, when two components or directions are described as extending substantially parallel or perpendicular to each other, the two components or directions extend exactly parallel or perpendicular to each other, or extend approximately parallel or perpendicular to each other as would be understood by a person having ordinary skill in the art.

Figure 1B:
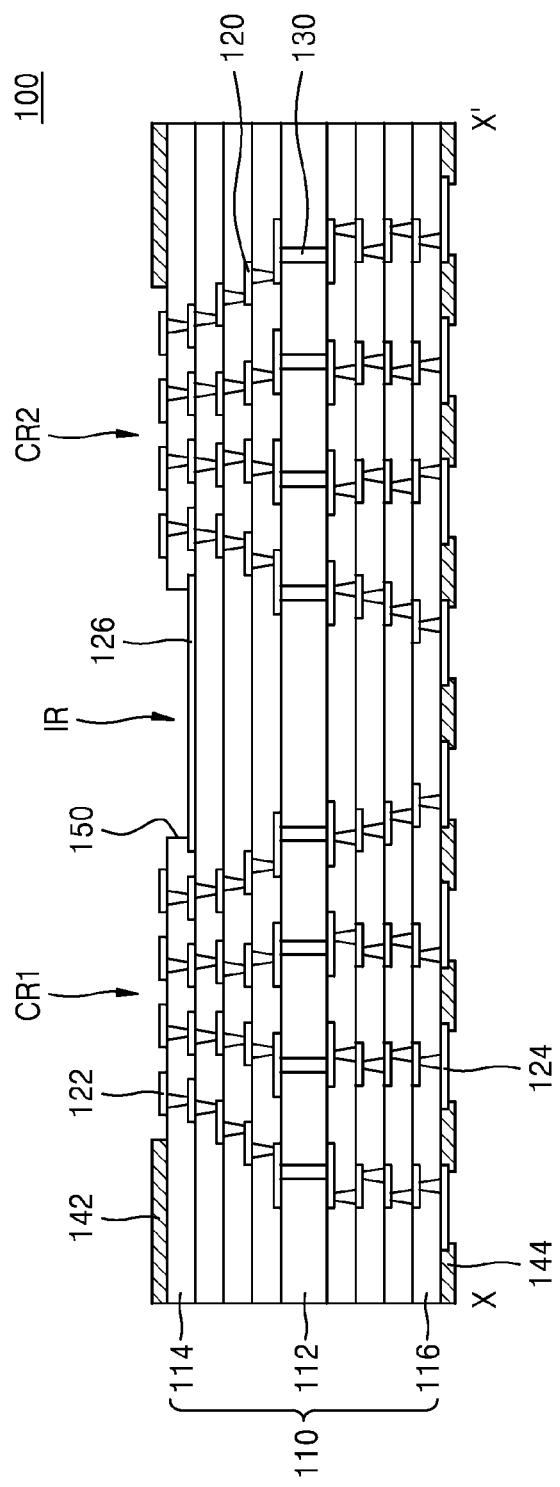
Figure 1C:
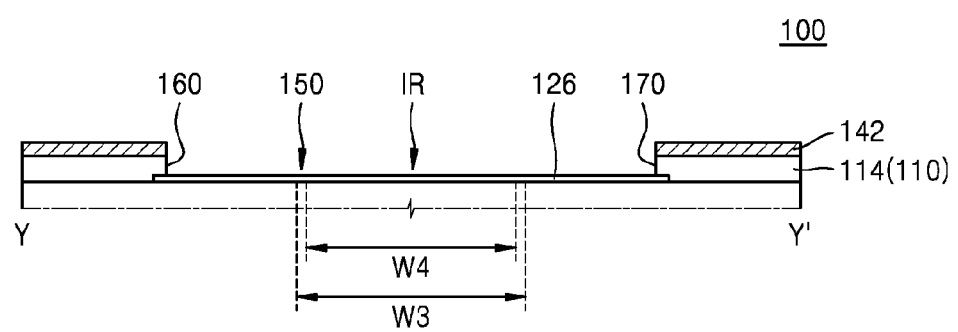

FIGS. 1A through 1C are plan and cross-sectional views of a printed circuit board (PCB) 100 according to an exemplary embodiment of the inventive concept. FIGS. 1B and 1C are cross-sectional views respectively taken along lines X-X' and Y-Y' of FIG. 1A. FIG. 1A is a plan view of an upper side of the PCB 100.

Exemplary embodiments of the inventive concept provide a printed circuit board (PCB) that provides reliable interconnections between a plurality of semiconductor chips. Exemplary embodiments of the inventive concept also provide a semiconductor package including a plurality of semiconductor chips that provides reliable interconnections between the plurality of semiconductor chips.

Referring to FIGS. 1A through 1C, the PCB 100 may include a substrate base 110, wiring patterns 120, and conductive vias 130.

In exemplary embodiments, the PCB 100 may be a multilayer PCB having the substrate base 110, which includes a stack of a plurality of base layers 112, 114, and 116. In exemplary embodiments, each of the plurality of base layers 112, 114, and 116 in the substrate base 110 may include, for example, at least one material selected from among phenolic resin, epoxy resin, and polyimide. For example, in an exemplar embodiment, each of the plurality of base layers 112, 114, and 116 in the substrate base 110 may include at least one material selected from among frame retardant 4 (FR4), tetrafunctional epoxy, polyphenylene ether, epoxy/polyphenylene oxide, bismaleimide triazine (BT), thermount, cyanate ester, polyimide, and liquid crystal polymer.

In exemplary embodiments, the base layer 112 may be a core base layer, and at least one sub base layer 114 and at least one sub base layer 116 may be respectively placed on an upper surface and a lower surface of the core base layer 112. The at least one sub base layer 114 may be stacked on the upper surface of the core base layer 112. The at least one sub base layer 116 may be stacked on the lower surface of the core base layer 112. Although the exemplary embodiment shown in FIG. 1B includes one core base layer 112 the inventive concept is not limited thereto. For example, in exemplary embodiments, the substrate base 110 may include a plurality of core base layers, and may further include at least one sub base layer interposed between the plurality of core base layers.

The wiring patterns 120 may be disposed on upper and lower surfaces of each of the plurality of base layers 112, 114, and 116. The wiring patterns 120 may include, for example, electrolytically deposited (ED) copper foil, a rolled-annealed (RA) copper foil, a stainless steel foil, an aluminum foil, an ultra-thin copper foil, sputtered copper, copper alloys, etc.

The conductive vias 130 may electrically connect the wiring patterns 120. The conductive vias 130 may pass through at least one of the plurality of base layers 112, 114, and 116. In exemplary embodiments, the conductive vias 130 may include, for example, copper, nickel, stainless steel, or beryllium copper.

An upper solder resist layer 142 and a lower solder resist layer 144 may be respectively formed on upper and lower surfaces of the substrate base 10.

In exemplary embodiments, each of the upper solder resist layer 142 and the lower solder resist layer 144 may be formed by, for example, coating the upper and lower surfaces of the substrate base 110 with solder mask insulating ink by using screen printing or inkjet printing, and hardening the coated solder mask insulating ink through heating or irradiating ultraviolet (UV) rays or infrared (IR) rays.

In exemplary embodiments, each of the upper solder resist layer 142 and the lower solder resist layer 144 may be formed by, for example, coating (e.g., entirely coating) the upper and lower surfaces of the substrate base 110 with a photoimageable solder resist by using screen printing or spray coating, or bonding the upper and lower surfaces of the substrate base 110 with a film type solder resist material by using laminating, removing an unnecessary portion by using exposure and development, and hardening the coated photoimageable solder resist or the bonded film type solder resist material through heating or irradiating UV rays or IR rays.

A plurality of upper pads 122 and a plurality of lower pads 124 may be respectively disposed on the upper and lower surfaces of the substrate base 110. Parts of the wiring patterns 120 formed in the upper and lower surfaces of the substrate base 110, which are not covered by the upper solder resist layer 142 and the lower solder resist layer 144 but are exposed, may respectively be the upper pads 122 and the lower pads 124 of the PCB 100. A metal layer may be formed on each of the upper pads 122 and the lower pads 124. The metal layer may be formed to increase adhesion of each of the upper pads 122 and the lower pads 124 and reduce a contact resistance thereof. The metal layer may include, for example, hot air solder leveling (HASL), Ni/Au plating, etc.

In an exemplary embodiment, the upper solder resist layer 142 is not formed in a plurality of chip attach regions CR1 and CR2 of the upper surface of the substrate base 110, which are regions onto which semiconductor chips are to be attached. The plurality of chip attach regions CR1 and CR2 may include a first chip attach region CR1 and a second chip attach region CR2 that are spaced apart from each other in a first direction (a direction of the line X-X'). A first semiconductor chip and a second semiconductor chip may be respectively attached onto the first chip attach region CR1 and the second chip attach region CR2. The first chip attach region CR1 and the second chip attach region CR2 may respectively have a first width W1 and a second width W2 in a second direction (a direction of the line Y-Y') substantially perpendicular to the first direction (the direction of the line X-X'). In exemplary embodiments, the first width W1 and the second width W2 may be substantially equal to each other. However, the inventive concept is not limited thereto. For example, in exemplary embodiments, the first width W1 may be greater than the second width W2, or the second width W2 may be greater than the first width W1.

In exemplary embodiments, the upper solder resist layer 142 is not formed on a part of the upper surface of the substrate base 110 adjacent to the chip attach regions CR1 and CR2.

The plurality of upper pads 122 may be disposed in the chip attach regions CR1 and CR2 of the upper surface of the substrate base 110. In exemplary embodiments, parts of the wiring patterns 120 electrically connected to the upper pads 122 may be formed in the chip attach regions CR1 and CR2 of the upper surface of the substrate base 110 in which the upper solder resist layer 142 is not formed, and in some regions adjacent to the chip attach regions CR1 and CR2. In exemplary embodiments, the wiring patterns 120, other than the plurality of upper pads 122, is not formed in the chip attach regions CR1 and CR2 of the upper surface of the substrate base 110 in which the upper solder resist layer 142 is not formed and in some regions adjacent to the chip attach regions CR1 and CR2. In this case, the plurality of upper pads 122 may be electrically connected to other parts of the wiring patterns 120 through the conductive vias 130.

An accommodation cavity 150 may have a predetermined depth from the uppermost surface of the base substrate 110 and may be recessed in a part of an upper side of the base substrate 110. The accommodation cavity 150 may overlap a part of the first chip attach region CR1 and a part of the second chip attach region CR2.

The accommodation cavity 150 may have a third width W3 in the second direction (the direction of the line Y-Y'). The third width W3 may be less than the first width W1 and the second width W2.

The accommodation cavity 150 may be formed in a part of the first chip attach region CR1 and a part of the second chip attach region CR2, as well as in a region between the part of the first chip attach region CR1 and the second chip attach region CR2. For example, the accommodation cavity 150 may be formed in a region spaced between parts in contact with one side of each of the first chip attach region CR1 and the second chip attach region CR2 that face each other, the part of the first chip attach region CR1, and the part of the second chip attach region CR2. For example, the accommodation cavity 150 may overlap a part of the first chip attach region CR1, a part of the second chip attach region CR2, and a region between the part of the first chip attach region CR1 and the second chip attach region CR2.

The accommodation cavity 150 may include an interposer attach region IR. A wiring interposer may be attached to the interposer attach region IR in the accommodation cavity 150. The interposer attach region IR may overlap a part of the first chip attach region CR1 and a part of the second chip attach region CR2. The first semiconductor chip and the second semiconductor chip that are attached to the chip attach regions CR1 and CR2 may be electrically connected to each other through the wiring interposer. A depth from the upper surface of the substrate base 110 to a bottom surface of the accommodation cavity 150 may be greater than a thickness of the wiring interposer.

The interposer attach region IR may have a fourth width W4 in the second direction (the direction of the line Y-Y'). Thus, the wiring interposer may have the fourth width W4. The fourth width W4 may be less than the third width W3. Thus, the fourth width W4 may be less than the first width W1 and the second width W2. Therefore, a width of the wiring interposer in the second direction (the direction of the line Y-Y') may be less than a width of the first semiconductor chip and a width of the second semiconductor chip.

Spacing grooves 160 and 170 may be formed in at least one side of the accommodation cavity 150 in the second direction (the direction of the line Y-Y') and may connect to the accommodation cavity 150. The spacing grooves 160 and 170 may have a predetermined depth from the uppermost surface of the substrate base 110, may be recessed in a part of the upper side of the substrate base 110, and may connect to the accommodation cavity 150. The spacing grooves 160 and 170 may extend from at least one side of the accommodation cavity 150 in the second direction (the direction of the line Y-Y').

In exemplary embodiments, the accommodation cavity 150 and the spacing grooves 160 and 170 may be recessed in the uppermost surface of the substrate base 110. In exemplary embodiments, the accommodation cavity 150 and the spacing grooves 160 and 170 may be recessed in the uppermost surface of the substrate base 110 at substantially the same depth. For example, in exemplary embodiments, a depth from the uppermost surface of the substrate base 110 to the lowermost surface of the accommodation cavity 150 may be substantially equal to a depth from the uppermost surface of the substrate base 110 to the lowermost surface of the spacing grooves 160 and 170. The spacing grooves 160 and 170 may be formed in a region between the first chip attach region CR1 and the second chip attach region CR2 in the substrate base 110. In exemplary embodiments, the spacing grooves 160 and 170 may be spaced apart from the first chip attach region CR1 and the second chip attach region CR2.

The spacing grooves 160 and 170 may include the first spacing groove 160 and the second spacing groove 170 that respectively extend from respective sides of the accommodation cavity 150 in the second direction (the direction of the line Y-Y'). In exemplary embodiments, the first spacing groove 160 and the second spacing groove 170 may respectively extend about the same length from respective sides of the accommodation cavity 150 in the second direction (the direction of the line Y-Y'). For example, in an exemplary embodiment, the length of the first spacing groove 160 may be substantially equal to the length of the second spacing groove 170. In an exemplary embodiment, the length of the first spacing groove 160 may be different from the length of the second spacing groove 170. In exemplary embodiments, the first spacing groove 160 and the second spacing groove 170 are disposed within the region between the first chip attach region CR1 and the second chip attach region CR2 (e.g., the first spacing groove 160 and the second spacing groove 170 do not extend beyond the region between the first chip attach region CR1 and the second chip attach region CR2), and may extend from the accommodation cavity 150 in the second direction (the direction of the line Y-Y').

An etching stop pattern 126 may be disposed on a bottom surface of each of the accommodation cavity 150, the first spacing groove 160, and the second spacing groove 170. The etching stop pattern 126 may be a part of the wiring pattern 120. In exemplary embodiments, the etching stop pattern 126 may be electrically connected to another part of the wiring patterns 120.

To form the PCB 100, a preparatory PCB including the base substrate 110, the wiring patterns 120, and the conductive vias 130, and excluding the accommodation cavity 150, the first spacing groove 160, and the second spacing groove 170, may be prepared. Thereafter, the accommodation cavity 150, the first spacing groove 160, and the second spacing groove 170 may be formed. The accommodation cavity 150, the first spacing groove 160, and the second spacing groove 170 may be formed by removing a part of the upper side of the substrate base 110 by using the etching stop pattern 126 as an etching stop layer. The PCB 100 may be formed by forming the upper solder resist layer 142 and the lower solder resist layer 144 in parts of the upper and lower surfaces of the substrate base 110, respectively.

In FIGS. 1B and 1C, the accommodation cavity 150, the first spacing groove 160, and the second spacing groove 170 are formed by removing the one upper base layer 114 from among the plurality of base layers 112, 114, and 116 included in the substrate base 110. However, the inventive concept is not limited thereto. For example, in exemplary embodiments, the accommodation cavity 150, the first spacing groove 160, and the second spacing groove 170 may be formed by removing two or more upper base layers 114. The number of upper base layers 114 removed may be determined based on a thickness of the wiring interposer that is to be disposed in the accommodation cavity 150.

In exemplary embodiments, the etching stop pattern 126 may be removed from the bottom surface of each of the accommodation cavity 150, the first spacing groove 160, and the second spacing groove 170 after forming the accommodation cavity 150, the first spacing groove 160, and the second spacing groove 170.

The accommodation cavity 150, the first spacing groove 160, and the second spacing groove 170 may be formed, for example, through laser drilling or wet etching.

FIGS. 2A through 2D are plan views of PCBs 100a, 100b, 100c, and 100d according to exemplary embodiments of the inventive concept. A further description of elements previously described may be omitted herein.

Referring to FIG. 2A, in an exemplary embodiment, the PCB 100a may include the substrate base 110. The accommodation cavity 150 may have a predetermined depth from the uppermost surface of the base substrate 110, and may be recessed in a part of an upper side of the base substrate 110. Spacing grooves 160a and 170a may be formed in at least one side of the accommodation cavity 150 and may connect to the accommodation cavity 150. The spacing grooves 160a and 170a may include the first spacing groove 160a and the second spacing groove 170a that respectively extend from respective sides of the accommodation cavity 150. In exemplary embodiments, the first spacing groove 160a and the second spacing groove 170a may respectively extend about the same length from respective sides of the accommodation cavity 150. For example, the length of the first spacing groove 160a may be substantially the same as the length of the second spacing groove 170a. In exemplary embodiments, the first spacing groove 160a and the second spacing groove 170a may respectively extend to outside of the first chip attach region CR1 and the second chip attach region CR2 into and across a region between the first chip attach region CR1 and the second chip attach region CR2.

The first spacing groove 160a and the second spacing groove 170a of the PCB 100a of FIG. 2A may extend relatively further than the first spacing groove 160 and the second spacing groove 170 of the PCB 100 of FIGS. 1A through 1C. For example, as shown in FIGS. 1A and 2A, the first spacing groove 160a and the second spacing groove 170a of FIG. 2A may extend further beyond the first chip attach region CR1 and the second chip attach region CR2 than the first spacing groove 160 and the second spacing groove 170 of FIG. 1A. The first spacing groove 160a and the second spacing groove 170a may extend at substantially the same width from both sides of the accommodation cavity 150. In exemplary embodiments, the length and width of the first spacing groove 160a may be substantially the same as the length and width of the second spacing groove 170a, and the first spacing groove 160a may be substantially aligned with the second spacing groove 170a at opposite sides of the accommodation cavity 150.

Referring to FIG. 2B, in an exemplary embodiment, the PCB 100b may include the substrate base 110. The accommodation cavity 150 may have a predetermined depth from the uppermost surface of the base substrate 110, and may be recessed in a part of an upper side of the base substrate 110. Spacing grooves 160b and 170b may be formed in at least one side of the accommodation cavity 150 and may connect to the accommodation cavity 150. The spacing grooves 160b and 170b may include the first spacing groove 160b and the second spacing groove 170b that respectively extend from both sides of the accommodation cavity 150. In exemplary embodiments, the first spacing groove 160b and the second spacing groove 170b may respectively extend at about the same length from both sides of the accommodation cavity 150. In exemplary embodiments, the length of the first spacing groove 160b may be substantially the same as the length of the second spacing groove 170b, and the first spacing groove 160b may be substantially aligned with the second spacing groove 170b at opposite sides of the accommodation cavity 150. In exemplary embodiments, the first spacing groove 160b and the second spacing groove 170b may respectively extend outside the first chip attach region CR1 and the second chip attach region CR2 into and across a region between the first chip attach region CR1 and the second chip attach region CR2.

The first spacing groove 160b and the second spacing groove 170b respectively include a first extension portion 162b and a second extension portion 172b that have relatively small widths (e.g., compared to the widths of the first and second end portions 164b and 174b) and extend from both sides of the accommodation cavity 150, and a first end portion 164b and a second end portion 174b that have relatively large widths (e.g., compared to the widths of the first and second extension portions 162b and 172b) at ends of the first spacing groove 160b and the second spacing groove 170b. The first end portion 164b and the second end portion 174b may be located outside the region between the first chip attach region CR1 and the second chip attach region CR2. In exemplary embodiments, the first and second extension portions 162b and 172b extend from the accommodation cavity 150 at a uniform width, and the first and second end portions 164b and 174b respectively extend from the first and second extension portions 162b and 172b and respectively have a width greater than the width of the first and second extension portions 162b and 172b.

In exemplary embodiments, the first end portion 164b and the second end portion 174b may have rectangular shapes in an upper surface of the substrate base 110.

For example, the first spacing groove 160b and the second spacing groove 170b respectively include the first extension portion 162b and the second extension portion 172b, which extend at substantially the same width from both sides of the accommodation cavity 150, and the first end portion 164b and the second end portion 174b which extend at relatively large widths (e.g. compared to the widths of the first extension portion 162b and the second extension portion 172b) from the first extension portion 162b and the second extension portion 172b. In exemplary embodiments, the length and width of the first extension portion 162b may be substantially the same as the length and width of the second extension portion 172b, and the first extension portion 162b may be substantially aligned with the second extension portion 172b at opposite sides of the accommodation cavity 150. In exemplary embodiments, the width of the first end portion 164b is greater than the width of the first extension portion 162b, and the width of the second end portion 174b is greater than the width of the second extension portion 172b.

Figure 2C:
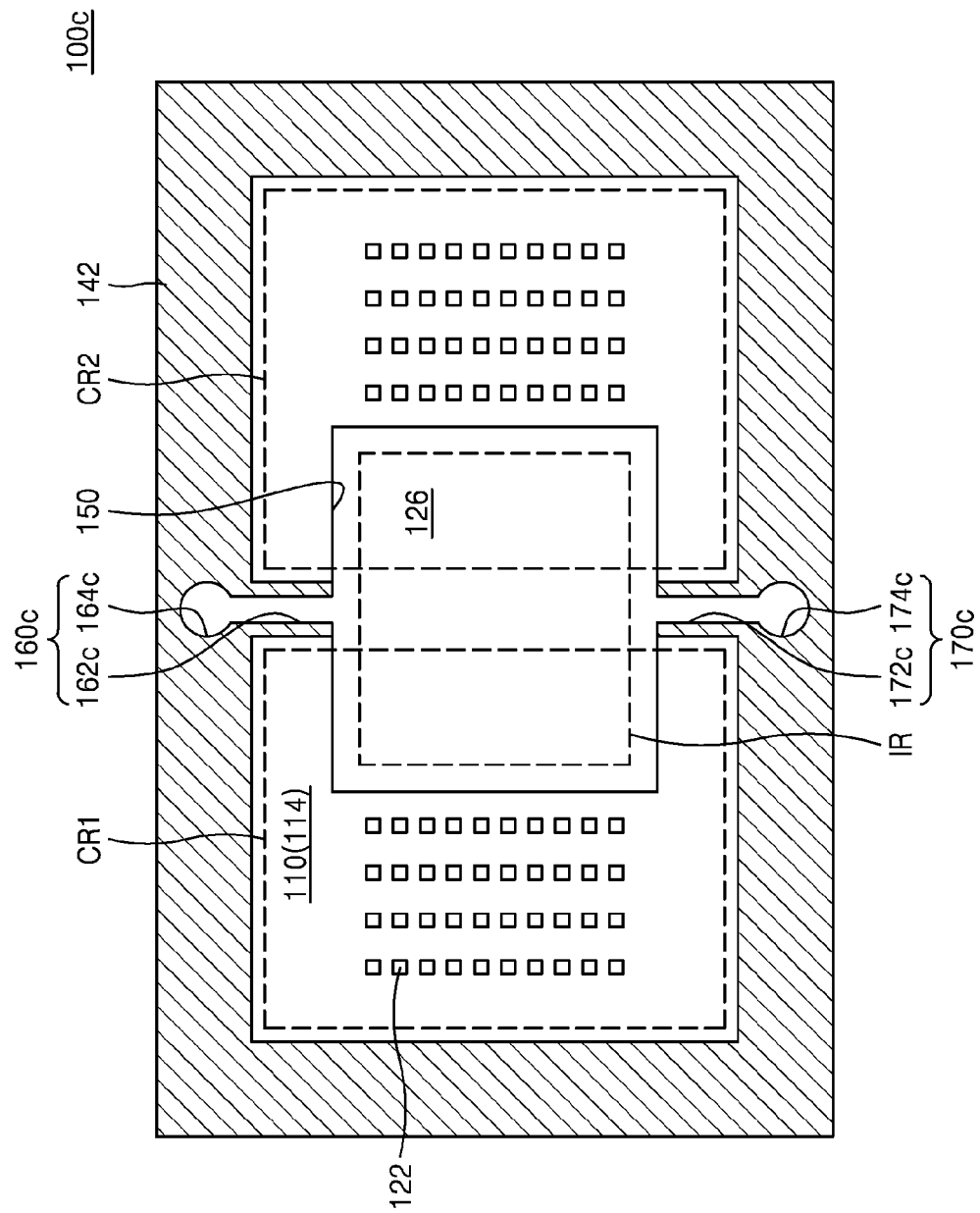

Referring to FIG. 2C, in an exemplary embodiment, the PCB 100c may include the substrate base 110. The accommodation cavity 150 may have a predetermined depth from the uppermost surface of the base substrate 110 and may be recessed in a part of an upper side of the base substrate 110. Spacing grooves 160c and 170c may be formed in at least one side of the accommodation cavity 150 and may connect to the accommodation cavity 150. The spacing grooves 160c and 170c may include the first spacing groove 160c and the second spacing groove 170c that respectively extend from both sides of the accommodation cavity 150. In exemplary embodiments, the first spacing groove 160c and the second spacing groove 170c may respectively extend at about the same length from both sides of the accommodation cavity 150. In exemplary embodiments, the length of the first spacing groove 160c may be substantially the same as the length of the second spacing groove 170c, and the first spacing groove 160c may be substantially aligned with the second spacing groove 170c at opposite sides of the accommodation cavity 150. In exemplary embodiments, the first spacing groove 160c and the second spacing groove 170c may respectively extend outside the first chip attach region CR1 and the second chip attach region CR2 into and across a region between the first chip attach region CR1 and the second chip attach region CR2.

The first spacing groove 160c and the second spacing groove 170c respectively include a first extension portion 162c and a second extension portion 172c that have relatively small widths (e.g. compared to the widths of the first and second end portions 164c and 174c) and extend from both sides of the accommodation cavity 150, and a first end portion 164c and a second end portion 174c that have relatively large widths (e.g., compared to the widths of the first and second extension portions 162c and 172c) at ends of the first spacing groove 160c and the second spacing groove 170c. In exemplary embodiments, the first end portion 164c and the second end portion 174c may have circular shapes in an upper surface of the substrate base 110.

Referring to FIG. 2D, in an exemplary embodiment, the PCB 100d may include the substrate base 110. The accommodation cavity 150 may have a predetermined depth from the uppermost surface of the base substrate 110, and may be recessed in a part of an upper side of the base substrate 110. Spacing grooves 160d and 170d may be formed in at least one side of the accommodation cavity 150 and may connect to the accommodation cavity 150. The spacing grooves 160d and 170d may include the first spacing groove 160d and the second spacing groove 170d that respectively extend from both sides of the accommodation cavity 150. In exemplary embodiments, the first spacing groove 160d and the second spacing groove 170d may respectively extend at about the same length from both sides of the accommodation cavity 150. In exemplary embodiments, the length of the first spacing groove 160d may be substantially the same as the length of the second spacing groove 170d, and the first spacing groove 160d may be substantially aligned with the second spacing groove 170d at opposite sides of the accommodation cavity 150. In exemplary embodiments, the first spacing groove 160d and the second spacing groove 170d may respectively extend outside the first chip attach region CR1 and the second chip attach region CR2 into and across a region between the first chip attach region CR1 and the second chip attach region CR2.

The first spacing groove 160d and the second spacing groove 170d respectively include a first extension portion 162d and a second extension portion 172d that have relatively small widths (e.g., compared to the widths of the first and second end portions 164d and 174d) and extend from both sides of the accommodation cavity 150, and a first end portion 164d and a second end portion 174d that have relatively large widths (e.g., compared to the widths of the first and second extension portions 162d and 172d) at ends of the first spacing groove 160d and the second spacing groove 170d. In exemplary embodiments, the first end portion 164d and the second end portion 174d may respectively extend from the first extension portion 162d and the second extension portion 172d and may have gradually increasing widths. For example, the widths of the first and second end portions 164d and 174d may respectively gradually increase in a direction away from the first and second extension portions 162d and 172d. In exemplary embodiments, the first end portion 164d and the second end portion 174d may have trapezoidal shapes in an upper surface of the substrate base 110.

The PCBs 100a, 100b, 100c, and 100d of FIGS. 2A through 2D are the same as the PCB 100 of FIGS. 1A through 1C except that the first spacing grooves 160a, 160b, 160c, and 160d, and the second spacing grooves 170a, 170b, 170c, and 170d extend relatively further (e.g., have relatively greater lengths) than the first spacing groove 160 and the second spacing groove 170 of FIGS. 1A through 1C, and that the first spacing grooves 160b, 160c, and 160d, and the second spacing grooves 170b, 170c, and 170d include end portions having different shapes and/or widths compared to the remaining portions of the corresponding spacing grooves. Thus, for convenience of explanation, a cross-sectional view of each of the PCBs 100a, 100b, 100c, and 100d is omitted herein.

Figure 3A:
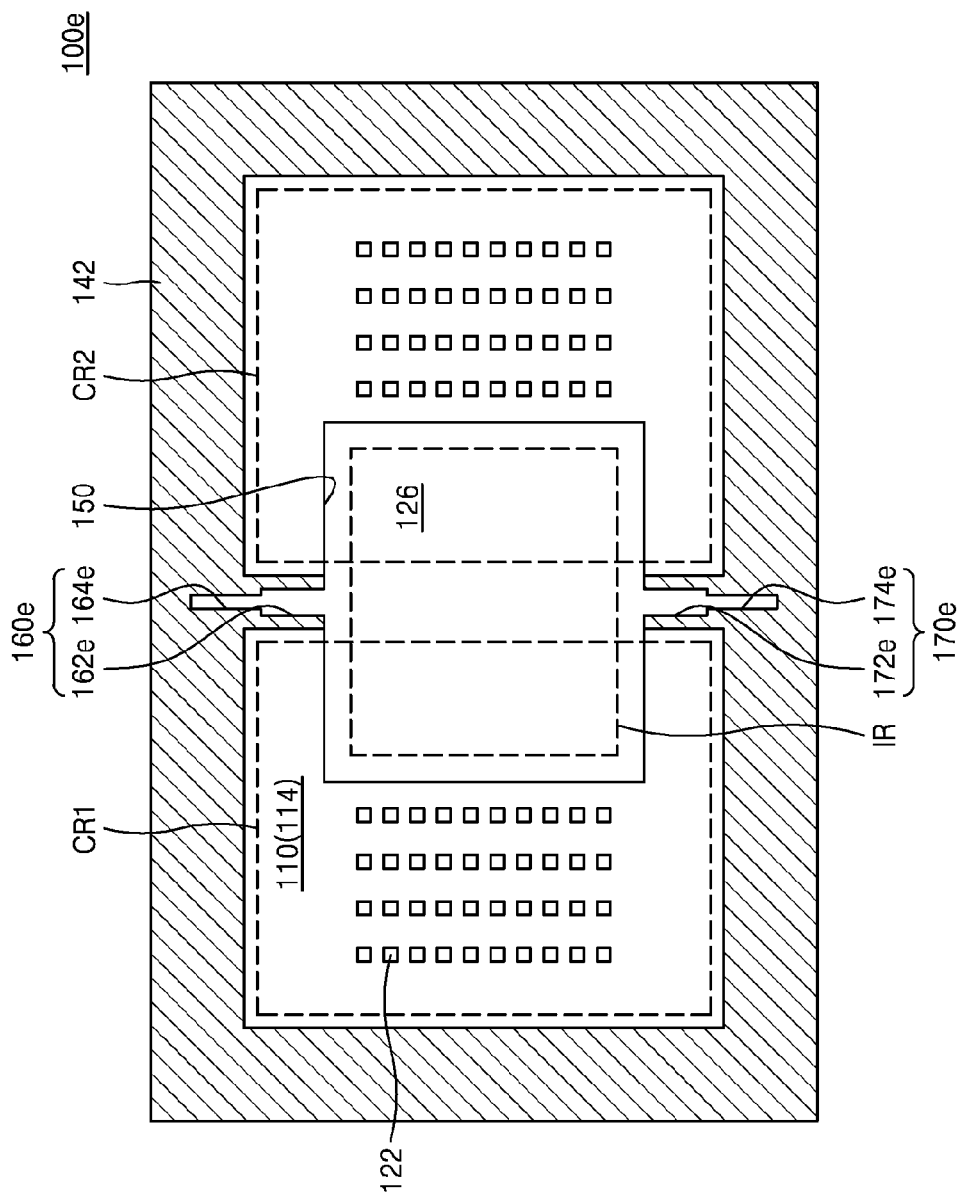
FIGS. 3A and 3B are plan views of PCBs according to exemplary embodiments of the inventive concept.
Figure 3B:
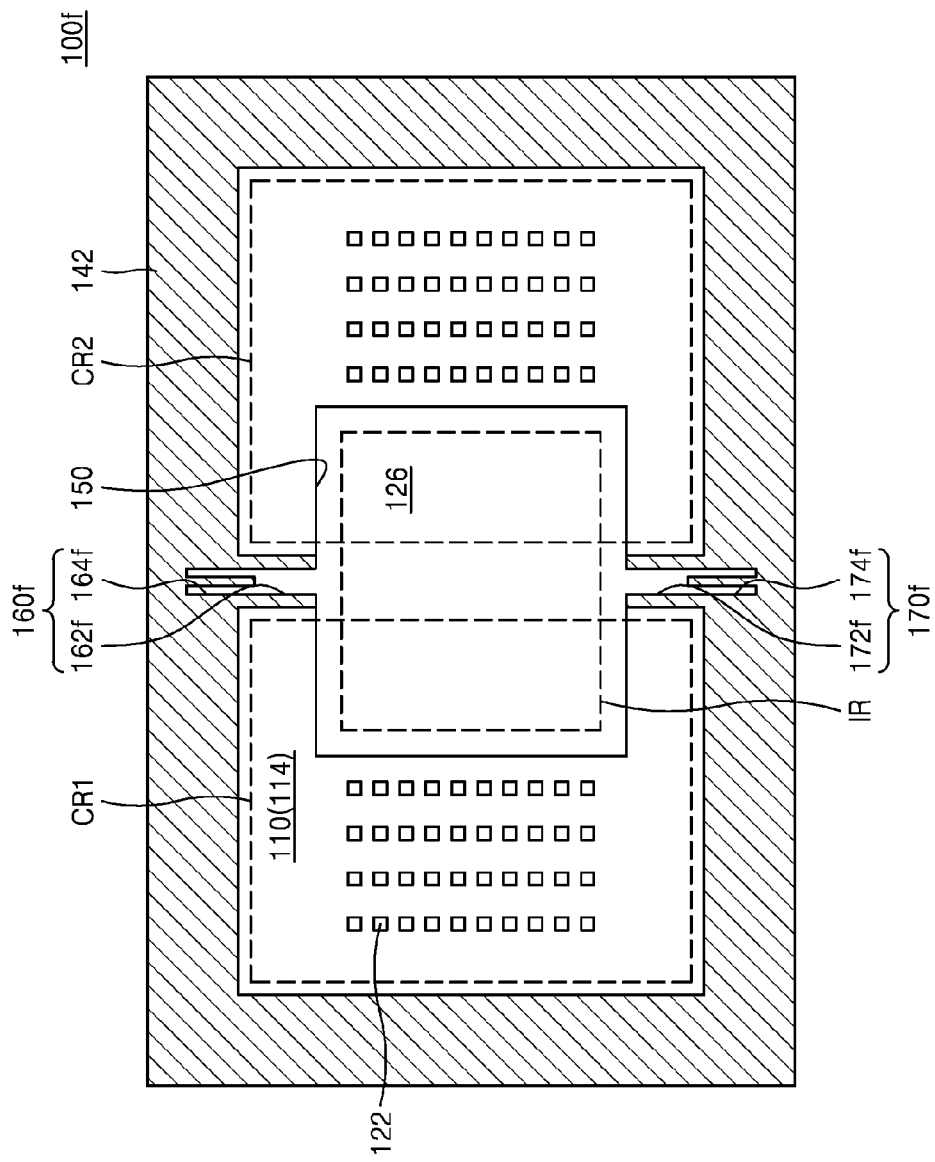

FIGS. 3A and 3B are plan views of PCBs 100e and 100f according to exemplary embodiments of the inventive concept. For convenience of explanation, a further description of elements previously described may be omitted herein.

Referring to FIG. 3A, in an exemplary embodiment, the PCB 100e may include the substrate base 110. The accommodation cavity 150 may have a predetermined depth from the uppermost surface of the base substrate 110, and may be recessed in a part of an upper side of the base substrate 110. Spacing grooves 160e and 170e may be formed in at least one side of the accommodation cavity 150 and may connect to the accommodation cavity 150. The spacing grooves 160e and 170e may include the first spacing groove 160e and the second spacing groove 170e that respectively extend from both sides of the accommodation cavity 150. In exemplary embodiments, the first spacing groove 160e and the second spacing groove 170e may respectively extend at about the same length from both sides of the accommodation cavity 150. In exemplary embodiments, the length of the first spacing groove 160e may be substantially the same as the length of the second spacing groove 170e, and the first spacing groove 160e may be substantially aligned with the second spacing groove 170e at opposite sides of the accommodation cavity 150. In exemplary embodiments, the first spacing groove 160e and the second spacing groove 170e may respectively extend outside of the first chip attach region CR1 and the second chip attach region CR2 into and across a region between the first chip attach region CR1 and the second chip attach region CR2.

The first spacing groove 160e and the second spacing groove 170e respectively include a first extension portion 162e and a second extension portion 172e that extend from both sides of the accommodation cavity 150, and a first end portion 164e and a second end portion 174e that have relatively small widths (e.g., compared to the widths of the first and second extension portions 162e and 172e) at ends of the first spacing groove 160e and the second spacing groove 170e. For example, the widths of the first and second end portions 164e and 174e may be respectively less than the widths of the first and second extension portions 162e and 172e. The first end portion 164e and the second end portion 174e may be located outside the region between the first chip attach region CR1 and the second chip attach region CR2. In exemplary embodiments, the first and second extension portions 162e and 172e extend from the accommodation cavity 150 at a uniform width, and the first and second end portions 164e and 174e respectively extend from the first and second extension portions 162e and 172e and respectively have a width less than the width of the first and second extension portions 162e and 172e.

Thus, in an exemplary embodiment, the first spacing groove 160e and the second spacing groove 170e respectively include the first extension portion 162e and the second extension portion 172e that extend at substantially the same width from both sides of the accommodation cavity 150, and the first end portion 164e and the second end portion 174e that extend at relatively small widths (e.g., compared to the widths of the first and second extension portions 162e and 172e) from the first extension portion 162e and the second extension portion 172e. In exemplary embodiments, the length and width of the first extension portion 162e may be substantially the same as the length and width of the second extension portion 172e, the length and width of the first end portion 164e may be substantially the same as the length and width of the second end portion 174e, and the first spacing groove 160e may be substantially aligned with the second spacing groove 170e at opposite sides of the accommodation cavity 150.

Referring to FIG. 3B, in an exemplary embodiment, the PCB 100f may include the substrate base 110. The accommodation cavity 150 may have a predetermined depth from the uppermost surface of the base substrate 110, and may be recessed in a part of an upper side of the base substrate 110. Spacing grooves 160f and 170f may be formed in at least one side of the accommodation cavity 150 and may connect to the accommodation cavity 150. The spacing grooves 160f and 170f may include the first spacing groove 160f and the second spacing groove 170f that respectively extend from both sides of the accommodation cavity 150. In exemplary embodiments, the first spacing groove 160f and the second spacing groove 170f may respectively extend at about the same length from both sides of the accommodation cavity 150. In exemplary embodiments, the length of the first spacing groove 160f may be substantially the same as the length of the second spacing groove 170f, and the first spacing groove 160f may be substantially aligned with the second spacing groove 170f at opposite sides of the accommodation cavity 150. In exemplary embodiments, the first spacing groove 160f and the second spacing groove 170f may respectively extend outside the first chip attach region CR1 and the second chip attach region CR2 into and across a region between the first chip attach region CR1 and the second chip attach region CR2.

The first spacing groove 160f and the second spacing groove 170f respectively include a first extension portion 162f and a second extension portion 172f that extend from both sides of the accommodation cavity 150, and a plurality of first end portions 164f and a plurality of second end portions 174f that have relatively small widths (e.g., compared to the widths of the first and second extension portions 162f and 172f) at ends of the first spacing groove 160f and the second spacing groove 170f.

Thus, in an exemplary embodiment, the first spacing groove 160f and the second spacing groove 170f respectively include the first extension portion 162f and the second extension portion 172f that extend at substantially the same width from both sides of the accommodation cavity 150, and the plurality of first end portions 164*f* and the plurality of second end portions 174*f* that are diverged and extend at relatively small widths (e.g., compared to the widths of the first and second extension portions 162*f* and 172*f*) from the first extension portion 162*f* and the second extension portion 172*f*. In exemplary embodiments, the length and width of the first extension portion 162*f* may be substantially the same as the length and width of the second extension portion 172*f*, the lengths and widths of the plurality of first end portions 164*f* may be substantially the same as the lengths and widths of the plurality of second end portions 174*e*, and the first spacing groove 160*f* may be substantially aligned with the second spacing groove 170*f* at opposite sides of the accommodation cavity 150. In the exemplary embodiment of FIG. 3B, each of the plurality of first end portions 164*f* and the plurality of second end portions 174*f* includes two end portions. However, the inventive concept is not limited thereto. For example, in exemplary embodiments, each of the plurality of first end portions 164*f* and the plurality of second end portions 174*f* may include three or more end portions. Further, in the exemplary embodiment of FIG. 3I, the plurality of first end portions 164*f* and the plurality of second end portions 174*f* extend in substantially the same direction. However, the inventive concept is not limited thereto. For example, in exemplary embodiments, some of the plurality of first end portions 164*f* may be diverged and extend in a different direction from the others, or all of the plurality of end portions 164*f* may be diverged and extend in different directions. Similarly, some of the plurality of second end portions 174*f* may be diverged and extend in a different direction from the others, or all of the plurality of second end portions 174*f* may be diverged and extend in different directions. In exemplary embodiments, the widths of the end portions included in the plurality of first end portions 164*f* may be substantially the same as one or another or different from one another. Similarly, in exemplary embodiments, the widths of the end portions included in the plurality of second end portions 174*f* may be substantially the same as one or another or different from one another.

Figure 4A:
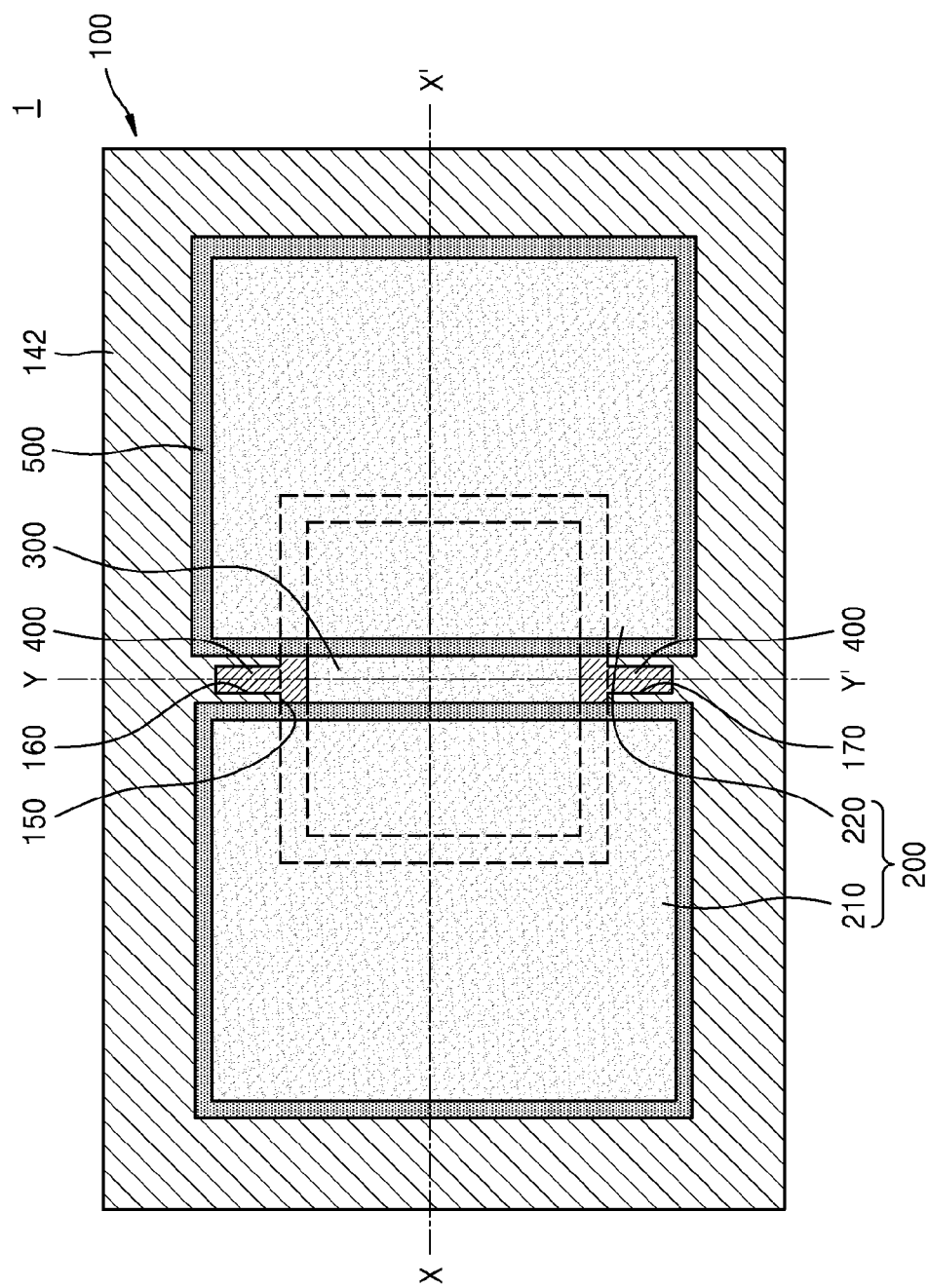
FIGS. 4A through 4C are plan layout and cross-sectional views of a semiconductor package according to an exemplary embodiment of the inventive concept.
Figure 4B:
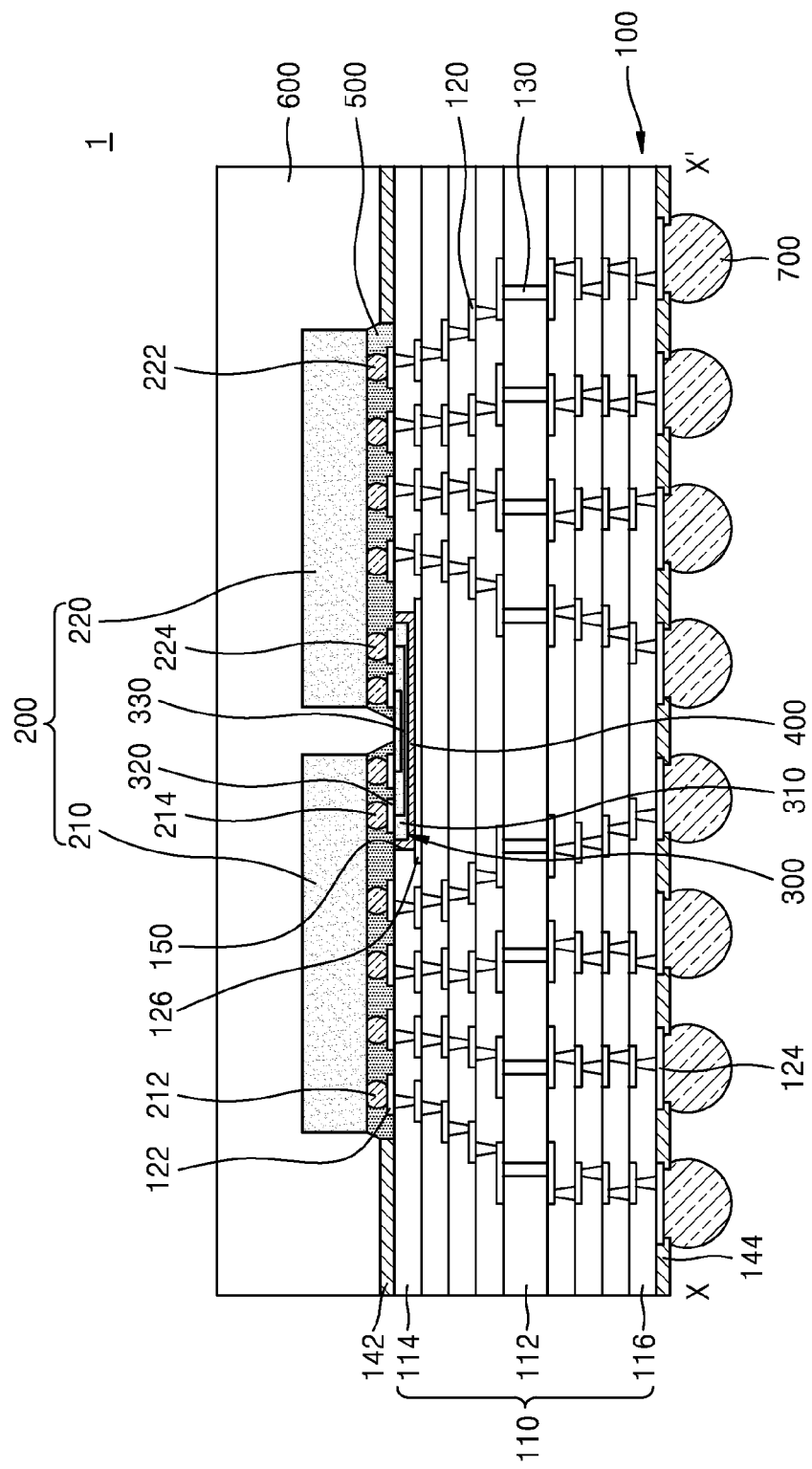
Figure 4C:
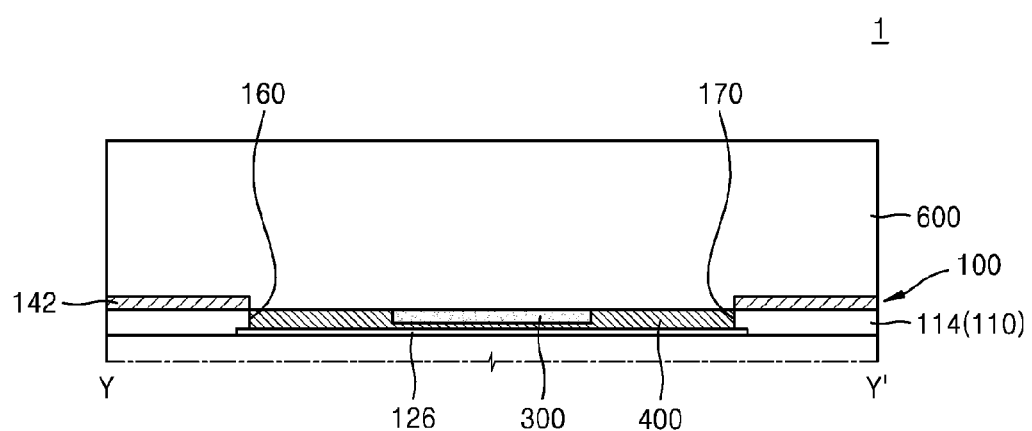

FIGS. 4A through 4C are plan layout and cross-sectional views of a semiconductor package 1 according to an exemplary embodiment of the inventive concept. FIGS. 4B and 4C are cross-sectional views respectively taken along lines X-X' and Y-Y' of FIG. 4A. For convenience of explanation, a further description of elements previously described may be omitted herein.

Referring to FIGS. 4A through 4C and FIGS. 1A through 1C, the semiconductor package 1 may include the PCB 100, a plurality of semiconductor chips 200, and a wiring interposer 300.

The plurality of semiconductor chips 200 may be attached to the plurality of chip attach regions CR1 and CR2 of the PCB 100. The wiring interposer 300 may be attached to an interposer attach region IR included in the accommodation cavity 150 of the PCB 100. The plurality of semiconductor chips 200 may include, for example, a first semiconductor chip 210 and a second semiconductor chip 220. The first semiconductor chip 210 and the second semiconductor chip 220 may be respectively attached to the first chip attach region CR1 and the second chip attach region CR2 of the PCB 100.

The plurality of semiconductor chips 200 may be, for example, memory semiconductor chips. A memory semiconductor chip may be a volatile memory chip such as, for example, a dynamic random-access memory (DRAM) or a static RAM (SRAM), or a non-volatile memory chip such as, for example, a phase-change RAM (PRAM), a magnetoresistive RAM (MRAM), a ferroelectric random access memory (FeRAM), or a resistive random-access memory (RRAM). The plurality of semiconductor chips 200 may be, for example, a logic semiconductor chip such as a central processing unit (CPU), a microprocessing unit (MPU), an application processor (AP), etc.

In exemplary embodiments, at least one of the plurality of semiconductor chips 200 may be a logic semiconductor chip, and the others may be memory semiconductor chips. For example, the first semiconductor chip 210 may be a logic semiconductor chip, and the second semiconductor chip 220 may be a memory semiconductor chip. In exemplary embodiments, the second semiconductor chip 220 may be a stack (e.g., all memory chips in the memory system taken together in one assembly, JEDEC Standard Definition) of a plurality of memory semiconductor chips. For example, the second semiconductor chip 220 may include a plurality of slices (e.g., one memory chip in the stack of memory chips, JEDEC Standard Definition). The plurality of slices may be connected to one another via a through electrode such as, for example, a through-silicon via (TSV). In exemplary embodiments, the second semiconductor chip 220 may be, for example, a high bandwidth memory (HBM) DRAM.

The wiring interposer 300 may include an interposer substrate 310, a plurality of connection pads 320 formed on the interposer substrate 310, and a connection wiring 330 formed in the interposer substrate 310 that electrically connects the plurality of connection pads 320. The interposer substrate 310 may be a semiconductor substrate. For example, the interposer substrate 310 may include silicon (Si). The plurality of connection pads 320 and the connection wiring 330 may be formed on the interposer substrate 310 through a general wiring process of a semiconductor device. For example, the connection wiring 330 may include a line wiring and a via plug. An inter-metal dielectrics layer (IMD) may be formed between the line wiring and the via plug. For example, the wiring interposer 300 may be formed in a semiconductor substrate by performing only the wiring process without forming an individual electronic device.

In exemplary embodiments, the upper surfaces of the wiring interposer 300 and the PCB may be disposed at the same level. For example, an upper surface of the interposer substrate 310 and an upper surface of the substrate base 110 may have the same level (e.g., the upper surface of the interposer substrate 310 and the upper surface of the substrate base 110 may be substantially aligned with one another at a same level). In exemplary embodiments, a height from the upper surface of the substrate base 110 to an upper surface of the upper pad 122 and a height from the upper surface of the interposer substrate 310 to an upper surface of the connection pad 320 may be substantially equal. The upper surface of the upper pad 122 of the PCB 100 and the upper surface of the connection pad 320 of the wiring interposer 300 may be disposed at the same level.

The wiring interposer 300 may be disposed/accommodated in the accommodation cavity 150 by an adhesion material layer 400. The wiring interposer 300 may be disposed/accommodated in the accommodation cavity 150 such that the upper surface of the interposer substrate 310 has the same level as the upper surface of the substrate base 110 (e.g., such that the upper surface of the interposer substrate 310 is substantially aligned with the upper surface of the substrate base 110 at the same level), and such that only the upper pad 122 protrudes from the upper surface of the interposer substrate 310. Spaces within the accommodation cavity 150 in which the wiring interposer 300 is not disposed may be filled by the adhesion material layer 400. The adhesion material layer 400 may also fill the spacing grooves 160 and 170 that connect to the accommodation cavity 150. In exemplary embodiments, the adhesion material layer 400 may partially fill the spacing grooves 160 and 170.

In the first chip attach region CR1 and the second chip attach region CR2 (e.g., at lower surfaces of the first semiconductor chip 210 and the second semiconductor chip 220), the upper surfaces of the substrate base 110, the interposer substrate 310, and the adhesion material layer 400 may have the same level (e.g., may be substantially aligned with one another at the same level). In exemplary embodiments, an upper surface of the adhesion material layer 400 filling the accommodation cavity 150 may have the same level as the upper surfaces of the substrate base 110 and the interposer substrate 310 (e.g., these upper surfaces may be substantially aligned with one another at the same level), and an upper surface of at least a part of the adhesion material layer 400 filling the spacing grooves 160 and 170 may have a lower level than the upper surfaces of the substrate base 110 and the interposer substrate 310 (e.g., an upper surface of at least a part of the adhesion material layer 400 filling the spacing grooves 160 and 170 may be below the upper surfaces of the substrate base 110 and the interposer substrate 310).

A process of disposing/accommodating the wiring interposer 300 in the accommodation cavity 150 will now be described.

In an exemplary embodiment, the wiring interposer 300 may be disposed in the accommodation cavity 150 after attaching an adhesion film to a lower surface of the wiring interposer 300. Alternatively, the wiring interposer 300 may be disposed in the accommodation cavity 150 after injecting an adhesion material into a part of the accommodation cavity 150. In this operation, a part of an upper side of the interposer substrate 310 may protrude from the upper surface of the substrate base 100.

Thereafter, the wiring interposer 300 may be disposed/ accommodated in the accommodation cavity 150 by pressing the wiring interposer 300 using a pressure plate to which a shock absorbing film is attached. In this regard, a space limited by the accommodation cavity 150 during a pressing process using the pressure plate with heat, excluding a portion in which the wiring interposer 300 is disposed/ accommodated, may be filled with the adhesion film or the adhesion material, and thus, the adhesion material layer 400 may be formed. The upper pad 122 of the PCB 100 and the connection pad 320 of the wiring interposer 300 may be buried in the shock absorbing film. Thus, the upper surface of the substrate base 110, the upper surface of the interposer substrate 310, and the upper surface of the adhesion material layer 400 filling the accommodation cavity 150 may have the same level (e.g., these upper surfaces may be substantially aligned with one another at the same level).

In exemplary embodiments, a depth from the upper surface of the substrate base 110 to a bottom surface of the accommodation cavity 150 may have a greater value than a thickness of the interposer substrate 310, and an area of the accommodation cavity 150 may have a greater value than an area of the wiring interposer 300. Thus, side walls and a lower surface of the accommodation cavity 150 and the wiring interposer 300 may be spaced apart from each other, and a space between the side walls and the lower surface of the accommodation cavity 150 and the wiring interposer 300 may be filled by the adhesion material layer 400. For example, in an exemplary embodiment, the adhesion material layer 400 may surround (e.g., completely surround) lower and side surfaces of the wiring interposer 300. For example, in an exemplary embodiment, the adhesion material layer 400 is disposed in the accommodation cavity 150, and is disposed between the wiring interposer 300 and side and lower surfaces of the accommodation cavity 150. Thus, the wiring interposer 300 is spaced apart from the side surfaces (also referred to as side walls) and the lower surface of the accommodation cavity 150 with the adhesion material layer 400 disposed therebetween. Thus, a part of the adhesion material layer 400 may be disposed between the etching stop pattern 126 and the lower surface of the wiring interposer 300. The spacing grooves 160 and 170 may be filled by a part of the adhesion film or the adhesion material that remains after completely filling the accommodation cavity 150. Thus, the adhesion material layer 400, along with the accommodation cavity 150, may fill the spacing grooves 160 and 170. In exemplary embodiments, the first spacing groove 160 and the second spacing groove 170 may respectively have lengths within a region between the first semiconductor chip 210 and the second semiconductor chip 220 (e.g., the first and second spacing grooves 150 and 170 may not extend beyond the region between the first and second semiconductor chips 210 and 220). Thus, the adhesion material layer 400 may be formed at a lower side of the first semiconductor chip 210, a lower side of the second semiconductor chip 220, and the region between the first semiconductor chip 210 and the second semiconductor chip 220.

When the volume of the interposer substrate 310 and the volume of the adhesion film or the adhesion material are the same as the volume of a space limited by the accommodation cavity 150 and the spacing grooves 160 and 170, the adhesion material layer 400 may have the same upper surface as the substrate base 110 in both the accommodation cavity 150 and the spacing grooves 160 and 170.

In exemplary embodiments, in consideration of a change in the volume of the adhesion film or the adhesion material that may occur during a process of forming the adhesion material layer 400, the volume of the space limited by the accommodation cavity 150 and the spacing grooves 160 and 170 may be greater than the volume of the interposer substrate 310 and the volume of the adhesion film or the adhesion material. In this case, the adhesion material layer 400 may completely fill the accommodation cavity 150 while partially filling the spacing grooves 160 and 170.

After the wiring interposer 300 is disposed/accommodated in the accommodation cavity 150, the first semiconductor chip 210 and the second semiconductor chip 220 may be attached to the PCB 100. The first semiconductor chip 210 and the second semiconductor chip 220 may respectively include first connection terminals 212 and 214 and second connection terminals 222 and 224. The first connection terminals 212 and 214 may include the first PCB connection terminal 212 and the first interposer connection terminal 214. The second connection terminals 222 and 224 may include the second PCB connection terminal 222 and the second interposer connection terminal 224.

The first semiconductor chip 210 may be attached onto the PCB 100 such that the first PCB connection terminal 212 is connected to the upper pad 122 of the PCB 100, and such that the first interposer connection terminal 214 is connected to the connection pad 320 of the wiring interposer 300. The second semiconductor chip 220 may be attached onto the PCB 100 such that the second PCB connection terminal 222 is connected to the upper pad 122 of the PCB 100, and such that the second interposer connection terminal 224 is connected to the connection pad 320 of the wiring interposer 300. Thus, a part of each of the first semiconductor chip 210 and the second semiconductor chip 220 may be attached onto the PCB 100 to overlap the wiring interposer 300.

The first semiconductor chip 210 may be electrically connected to the PCB 100 through the first PCB connection terminal 212, and may be electrically connected to the second semiconductor chip 220 through the first interposer connection terminal 214. Similarly, the second semiconductor chip 220 may be electrically connected to the PCB 100 through the second PCB connection terminal 222, and may be electrically connected to the first semiconductor chip 210 through the second interposer connection terminal 224.

For example, the first semiconductor chip 210 and the second semiconductor chip 220 may transfer signals therebetween through the first interposer connection terminal 214, the connection pad 320 to which the first interposer connection terminal 214 is connected, the connection wiring 330, and the connect pad 320 to which the second interposer connection terminal 224 is connected, and the second interposer connection terminal 224.

Power or ground may be transferred to at least a part of the first PCB connection terminal 212 and the second PCB connection terminal 222. A data signal may be transferred to at least a part of the first interposer connection terminal 214 and the second interposer connection terminal 224.

In exemplary embodiments, when the first semiconductor chip 210 is a logic semiconductor chip, and the second semiconductor chip 220 is a memory semiconductor chip, all of power, ground, a data signal, and a control signal may be transferred to the first PCB connection terminal 212, the data signal and the control signal may be transferred to the first interposer connection terminal 214 and the second interposer connection terminal 224, and power and ground may be transferred to the second PCB connection terminal 222.

An underfill layer 500 may be formed between the first semiconductor chip 210 and the second semiconductor chip 220 and the PCB 100 that accommodates the wiring interposer 300. The underfill layer 500 may be formed using, for example, a capillary underfill method. The underfill layer 500 may include, for example, epoxy resin. The underfill layer 500 may surround the first connection terminals 212 and 214 and the second connection terminals 222 and 224. In exemplary embodiments, the underfill layer 500 may cover an exposed upper surface of the substrate base 100 on which the upper solder resist layer 142 is not formed.

Thereafter, a molding layer 600 may be formed to cover an upper surface of the PCB 100 and the first semiconductor chip 210 and the second semiconductor chip 220, and an external connection terminal 700 may be attached to the lower pad 124 of the PCB 100, thus forming the semiconductor package 1. The molding layer 600 may include, for example, an epoxy mold compound (EMC).

In exemplary embodiments, the molding layer 600 does not cover upper surfaces of the first semiconductor chip 210 and the second semiconductor chip 220, and covers the upper surface of the PCB 100 and side surfaces of each of the first semiconductor chip 210 and the second semiconductor chip 220. In this case, the semiconductor package 1 may further include a heat dissipation member covering the upper surfaces of the first semiconductor chip 210 and the second semiconductor chip 220. The heat dissipation member may include, for example, a heat dissipation plate such as a heat slug or a heat sink. The heat dissipation member may further include, for example, a thermal interface material (TIM) interposed between the first semiconductor chip 210 and the second semiconductor chip 220. The TIM may include, for example, a paste, a film, etc.

According to exemplary embodiments of the inventive concept, since the upper surface of the upper pad 122 of the PCB 100 and the upper surface of the connection pad 320 of the wiring interposer 300 are substantially aligned at the same level, reliability of an electrical interconnection between the first semiconductor chip 210 and the wiring interposer 300 and an electrical interconnection between the second semiconductor chip 220 and the wiring interposer 300 may be increased. Thus, according to exemplary embodiments of the inventive concept, reliability of an electrical interconnection between the first semiconductor chip 210 and the second semiconductor chip 220 through the wiring interposer 300 in the semiconductor package 1 may be increased.

According to exemplary embodiments of the inventive concept, as a result of the spacing grooves 160 and 170, the upper surface of the substrate base 110, the upper surface of the interposer substrate 310, and the upper surface of the adhesion material layer 400 filling the accommodation cavity 500 may be substantially aligned with one another at the same level. Thus, a space between the substrate base 110, the interposer substrate 310, the adhesion material layer 400 filling the accommodation cavity 500, and the first semiconductor chip 210, as well as a space between the substrate base 110, the interposer substrate 310, the adhesion material layer 400 filling the accommodation cavity 500, and the second semiconductor chip 220, may have substantially uniform heights. As a result, the underfill layer 500 may smoothly fill the spaces, thereby increasing the reliability of the semiconductor package 1. For example, the underfill layer 500 may efficiently fill the spaces in a uniform manner.

FIG. 5 is a plan layout view of a semiconductor package 1a according to an exemplary embodiment of the inventive concept. For convenience of explanation, a further description of elements previously described may be omitted herein.

Referring to FIGS. 5 and 2A, the semiconductor package 1a may include the PCB 200a, the plurality of semiconductor chips 200, and the wiring interposer 300. The wiring interposer 300 and the PCB 100a may have upper surfaces disposed at the same level (e.g., the upper surfaces of the wiring interposer 300 and the PCB 100a may be substantially aligned with one another at the same level). An upper surface of the upper pad 122 of the PCB 100a and an upper surface of the connection pad 320 of the wiring interposer 300 may have the same level (e.g., these upper surfaces may be substantially aligned with one another at the same level).

The wiring interposer 300 may be disposed/accommodated in the accommodation cavity 150 by an adhesion material layer 400a. Spaces in the accommodation cavity 150 in which the wiring interposer 300 is not disposed may be filled by the adhesion material layer 400a. The adhesion material layer 400a may also fill the spacing grooves 160a and 170a that connect to the accommodation cavity 150. In exemplary embodiments, the adhesion material layer 400a may partially fill the spacing grooves 160a and 170a. In an exemplary embodiment, upper surfaces of the substrate base 110, the interposer substrate 310, and the adhesion material layer 400a may be substantially aligned with one another at the same level in a region below lower surfaces of the first semiconductor chip 210 and the second semiconductor chip 220.

The first spacing groove 160a and the second spacing groove 170a may extend outside the first semiconductor chip 210 and the second semiconductor chip 220 into and across a region between the first semiconductor chip 210 and the second semiconductor chip 220. Thus, the adhesion material layer 400a may be formed in a region below the lower side of the first semiconductor chip 210, a region below the lower side of the second semiconductor chip 220, a part of the region between the first semiconductor chip 210 and the second semiconductor chip 220, and outside the region between the first semiconductor chip 210 and the second semiconductor chip 220.

In exemplary embodiments, the adhesion material layer 400a may wholly fill the accommodation cavity 150, and partially fill the spacing grooves 160a and 170a.

Figure 6A:
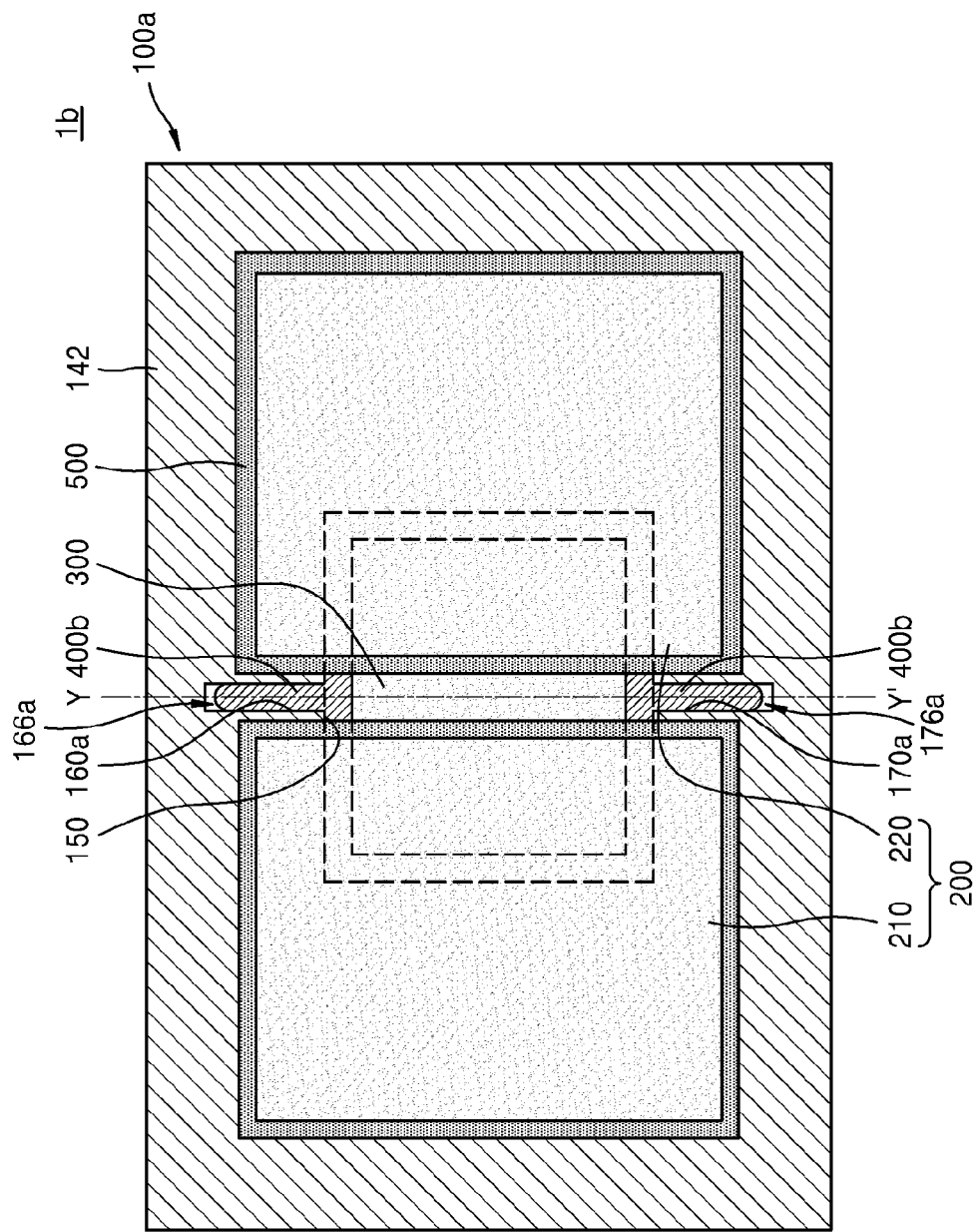
FIGS. 6A through 6C are plan layout and cross-sectional views of semiconductor packages according to exemplary embodiments of the inventive concept.
Figure 6B:
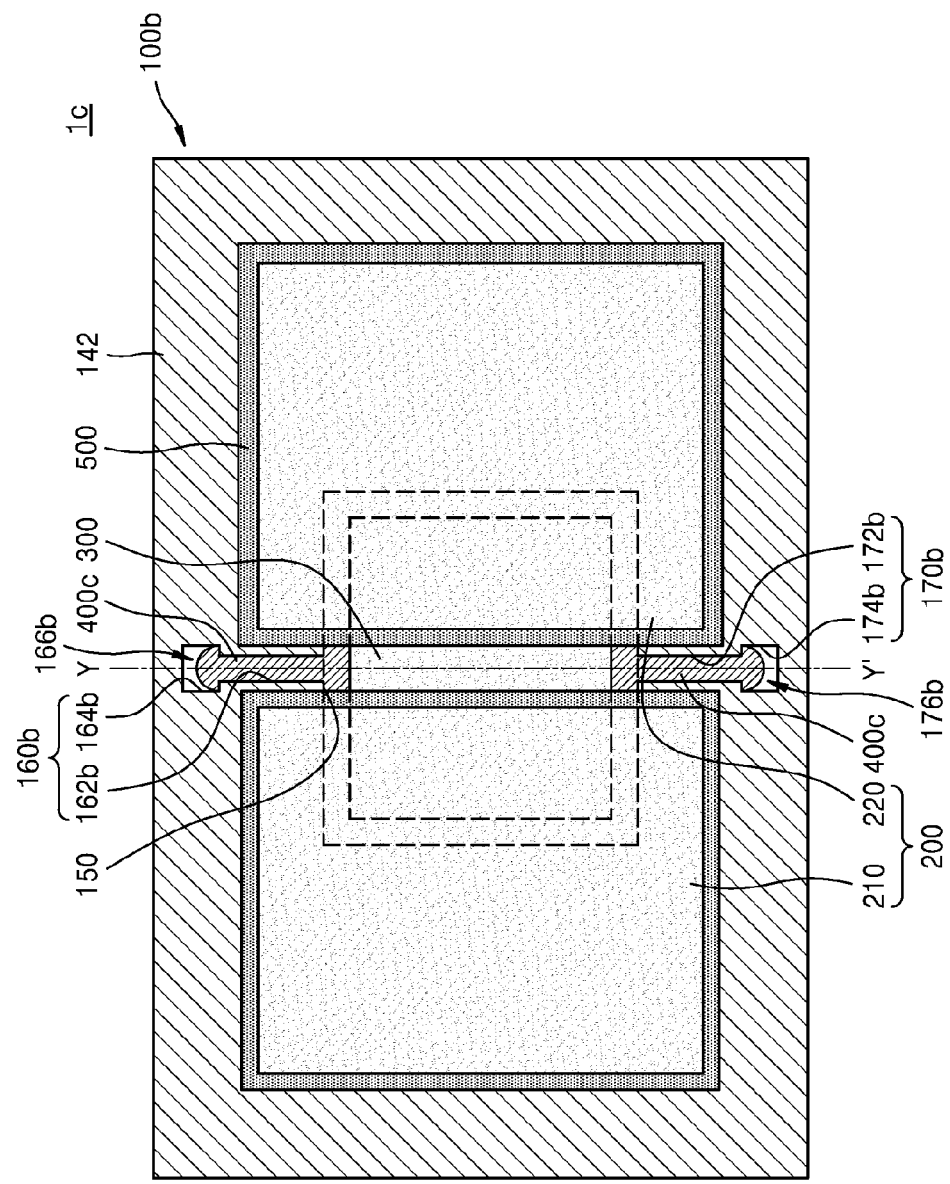
Figure 6C:
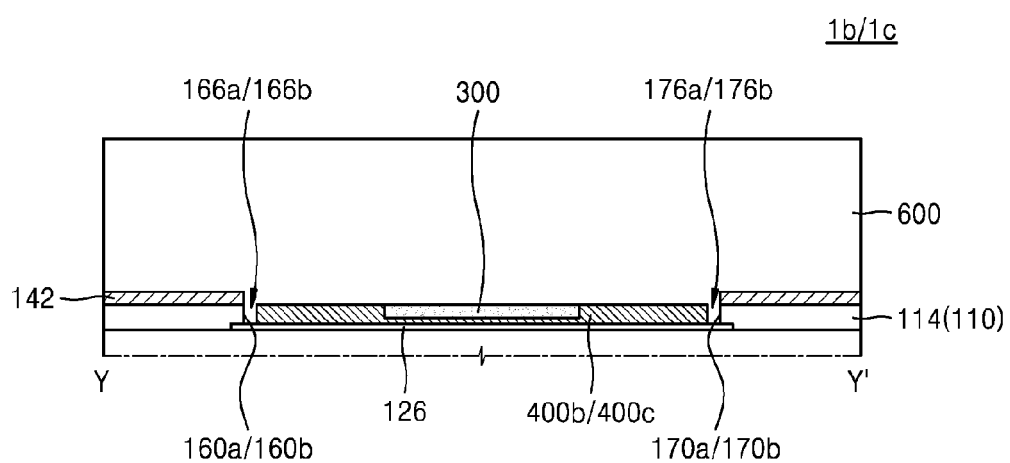

FIGS. 6A through 6C are plan layout and cross-sectional views of semiconductors packages 1b and 1c according to exemplary embodiments of the inventive concept. FIG. 6C is a cross-sectional view taken from line Y-Y' of FIG. 6A or line Y-Y' of FIG. 6B. For convenience of explanation, a further description of elements previously described may be omitted herein.

Referring to FIGS. 6A, 6C, and 2A, the semiconductor package 1b may include a PCB 100a, the plurality of semiconductor chips 200, and the wiring interposer 300.

The wiring interposer 300 may be disposed/accommodated in the accommodation cavity 150 by an adhesion material layer 400b. Spaces in the accommodation cavity 150 in which the wiring interposer 300 is not disposed may be filled by the adhesion material layer 400b. The adhesion material layer 400b may wholly fill the accommodation cavity 150 and partially fill the spacing grooves 160a and 170a. Spaces 166a and 176a of the spacing grooves 160a and 170a that are not filled by the adhesion material layer 400b may be filled by the molding layer 600.

Referring to FIGS. 6B, 6C, and 2B, the semiconductor package 1c may include a PCB 100b, the plurality of semiconductor chips 200, and the wiring interposer 300.

The wiring interposer 300 may be disposed/accommodated in the accommodation cavity 150 by an adhesion material layer 400c. Spaces in the accommodation cavity 150 in which the wiring interposer 300 is not disposed may be filled by the adhesion material layer 400c. The adhesion material layer 400c may wholly fill the accommodation cavity 150 and partially fill the spacing grooves 160b and 170b. For example, the adhesion material layer 400c may wholly fill the first extension portion 162b and the second extension portion 172b, and partially fill the first end portion 164b and the second end portion 174b. Spaces 166b and 176b of the first end portion 164b and the second end portion 174b that are not filled by the adhesion material layer 400c may be filled by the molding layer 600.

In the semiconductor packages 1b and 1c of FIGS. 6A through 6C, the volume of a space limited by the accommodation cavity 150 and the spacing grooves 160a and 170a or 160b and 170b may be greater than the volume of the adhesion material layers 400b and 400c. Thus, the spaces 166a and 176a or 166b and 176b that are not filled by the adhesion material layer 400b or 400c may be formed in the spacing grooves 160a and 170a or 160b and 170b, thereby preventing a part of the adhesion material layers 400b and 400c from overflowing onto an upper surface of the substrate base 110 during a process of forming the adhesion material layers 400b and 400c.

Therefore, in exemplary embodiments, the adhesion material layers 400b and 400c do not prevent an electrical interconnection between the first semiconductor chip 210 and the wiring interposer 300 and an electrical interconnection between the second semiconductor chip 220 and the wiring interposer 300, and do not prevent a smooth formation of the underfill layer 500. As a result, according to exemplary embodiments, the reliability of the semiconductor packages 1b and 1c is increased.

According to exemplary embodiments of the present inventive concept, a semiconductor package as described herein may be formed by utilizing the PCBs 100c and 100d of FIGS. 2C and 2D instead of the PCBs 100a and 100b of FIGS. 2A and 2B.

Figure 7A:
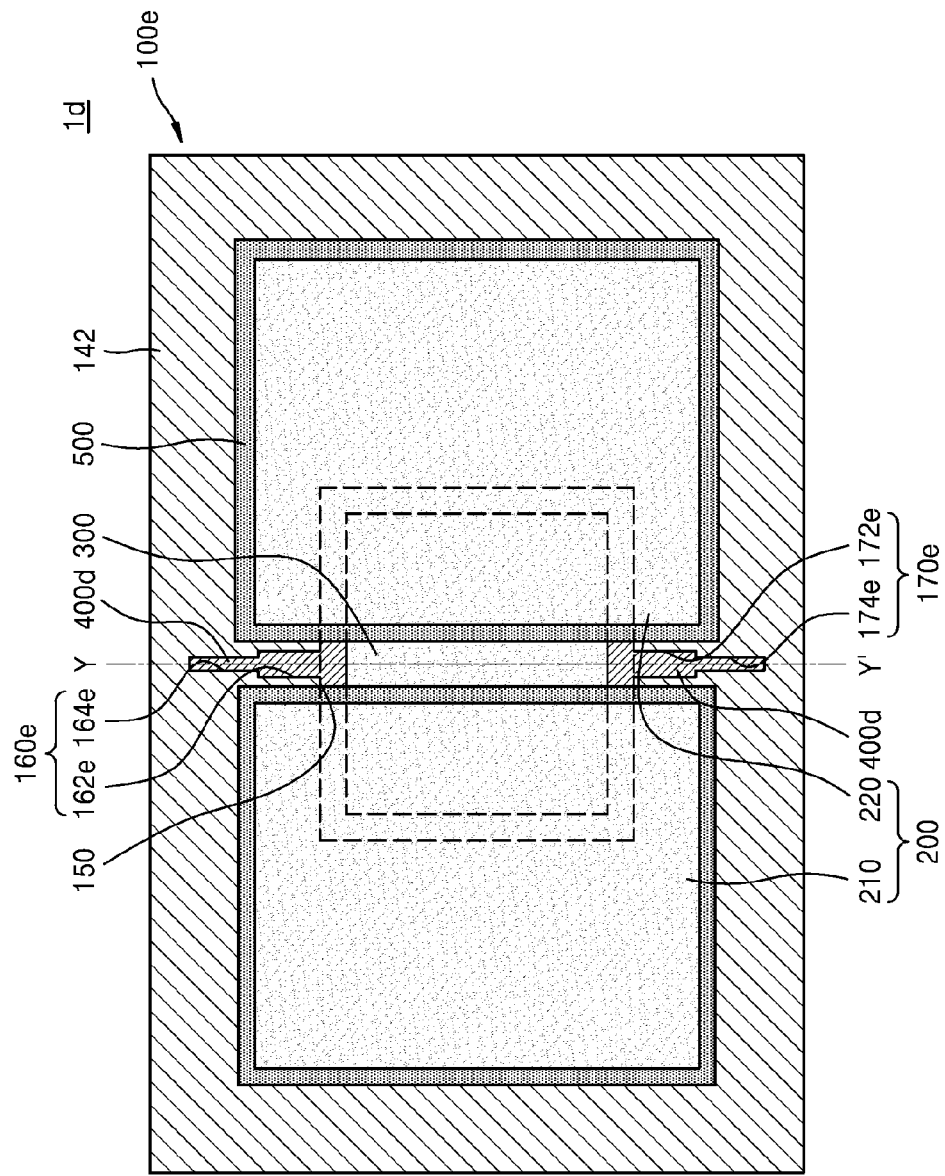
FIGS. 7A and 7B are plan layout and cross-sectional views of a semiconductor package according to an exemplary embodiment of the inventive concept.
Figure 7B:
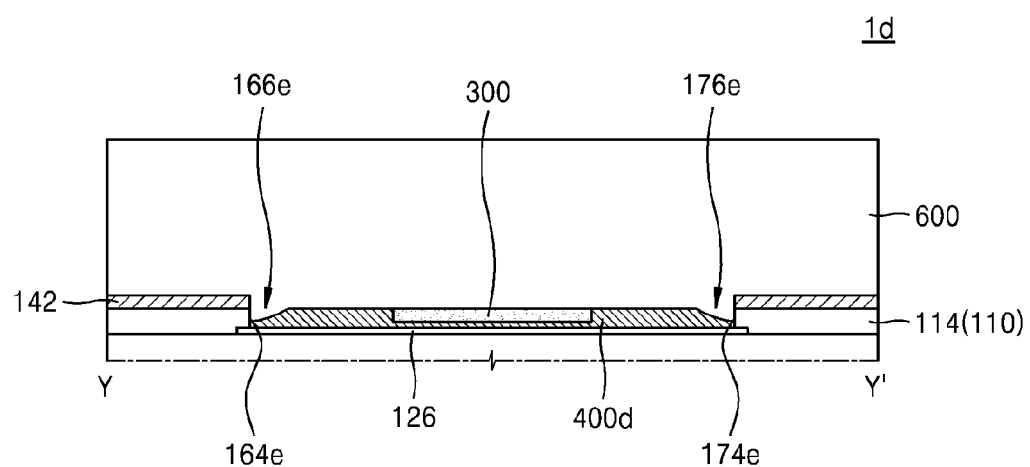

FIGS. 7A and 7B are plan layout and cross-sectional views of a semiconductor package 1d according to an exemplary embodiment of the inventive concept. FIG. 7B is a cross-sectional view taken along line Y-Y' of FIG. 7A. For convenience of explanation, a further description of elements previously described may be omitted herein.

Referring to FIGS. 7A, 7B, and 3A, the semiconductor package 1d may include the PCB 100e, the plurality of semiconductor chips 200, and the wiring interposer 300.

The wiring interposer 300 may be disposed/accommodated in the accommodation cavity 150 by an adhesion material layer 400d. Spaces in the accommodation cavity 150 that do not include the wiring interposer 300 may be filled by the adhesion material layer 400d. The adhesion material layer 400d may also fill the spacing grooves 160e and 170e that connect to the accommodation cavity 150.

The first spacing groove 160e and the second spacing groove 170e may respectively include a first extension portion 162e and a second extension portion 172e that extend from both sides of the accommodation cavity 150, and a first end portion 164e and a second end portion 174e that have relatively small widths (e.g., compared to the widths of the first and second extension portions 162e and 172e) at ends of the first spacing groove 160e and the second spacing groove 170e.

Due to the relatively small widths of the first end portion 164e and the second end portion 174e, the adhesion material layer 400d may fill the first end portion 164e and the second end portion 174e according to a capillary tube phenomenon. Thus, during a process of forming the adhesion material layer 400d, the adhesion material layer 400d may quickly move from the first end portion 164e to the second end portion 174e, thereby preventing a part of the adhesion material layer 400d from overflowing onto an upper surface of the substrate base 110.

In exemplary embodiments, the adhesion material layer 400d may fill only a part of a lower side of each of the first end portion 164e and the second end portion 174e. In exemplary embodiments, the adhesion material layer 400d may extend from the first extension portion 162e and the second extension portion 172e to an end of each of the first end portion 164e and the second end portion 174e, and the height of the upper surface of the adhesion material layer 400d may gradually decrease. Upper side spaces 166e and 176e of the ends of the first end portion 164e and the second end portion 174e that are not filled with the adhesion material layer 400d may be filled by the molding layer 600.

FIGS. 8 through 14 are plan layout views of semiconductor packages 2, 2a, 2b, 2c, 2d, 2e, and 2f according to exemplary embodiments of the inventive concept. For convenience of explanation, a further description of elements previously described may be omitted herein.

As shown in FIGS. 8 through 14, a semiconductor package may included a PCB having a plurality of accommodation cavities, and may include a plurality of wiring interposers disposed in the plurality of accommodation cavities.

Figure 8:
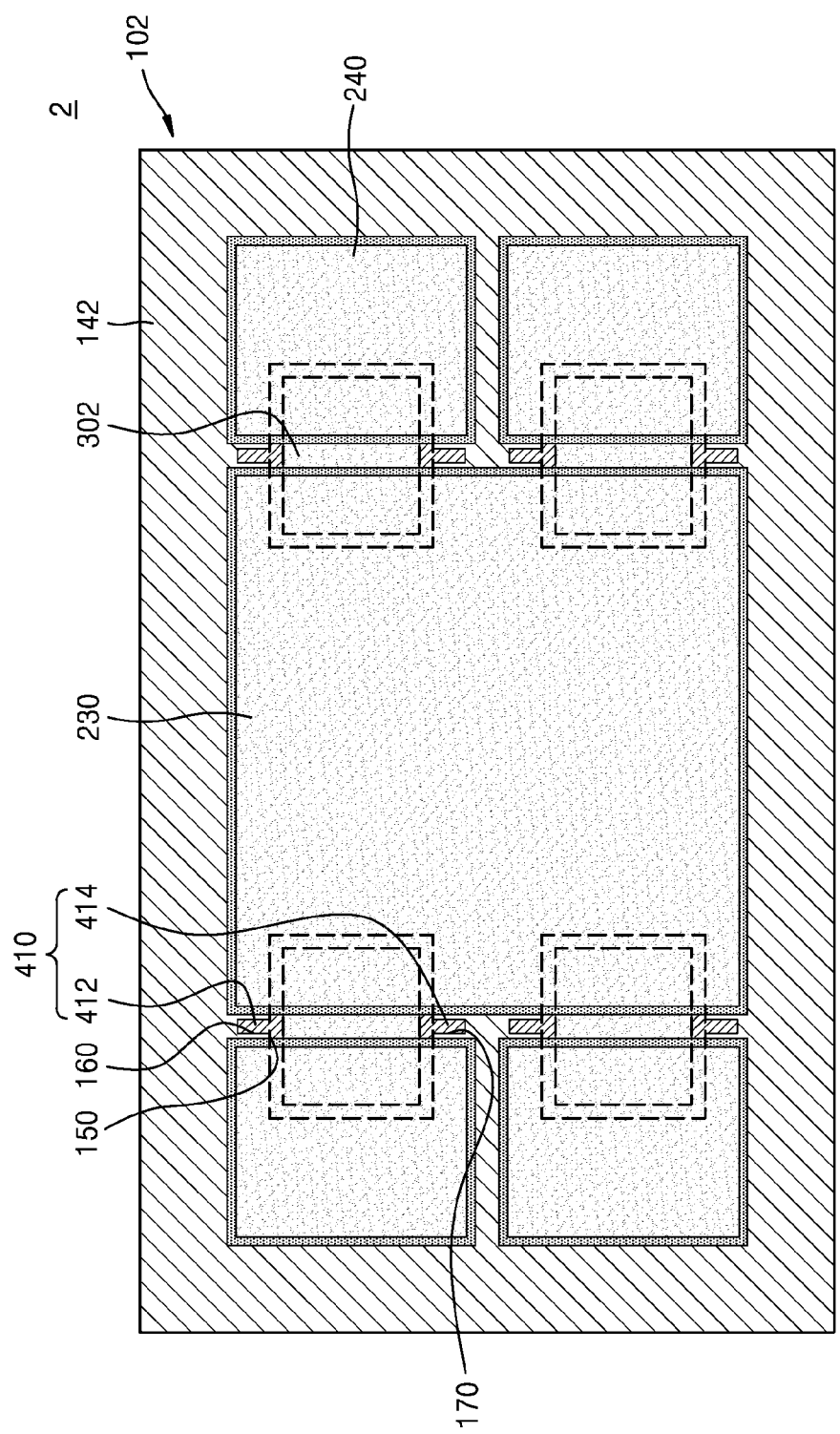
FIGS. 8 through 14 are plan layout views of semiconductor packages according to exemplary embodiments of the inventive concept.

Referring to FIG. 8, in an exemplary embodiment, the semiconductor package 2 may include a PCB 102, a first semiconductor chip 230, a plurality of second semiconductor chips 240, and a plurality of wiring interposers 302.

The second semiconductor chips 240 may be adjacent to both opposite sides of the first semiconductor chip 230. In an exemplary embodiment, two second semiconductor chips 240 may be adjacent to each side of the first semiconductor chip 230. However, the inventive concept is not limited thereto. For example, in exemplary embodiments, the second semiconductor chips 240 may be adjacent to only one side of the first semiconductor chip 230. In this case, the two second semiconductor chips 240 may be spaced apart from each other. In exemplary embodiments, the second semiconductor chips 240 may be adjacent to each of the four sides of the first semiconductor chip 230. In this case, two second semiconductor chips 240 may be adjacent to each side and spaced apart from each other. Alternatively, in exemplary embodiments, the second semiconductor chips 240 may be adjacent to at least one side of the first semiconductor chip 230. In this case, three or more second semiconductor chips 240 may be spaced apart from one another.

The first semiconductor chip 230 may be disposed such that one side thereof is on some of the at least two wiring interposers 302. The second semiconductor chips 240 may be arranged on a part of each of the at least two wiring interposers 302.

A part of the semiconductor package 2 including the first semiconductor chip 230 and one second semiconductor chip 240 is substantially similar to the semiconductor package 1 of FIGS. 4A through 4C. Thus, a further detailed description thereof is omitted. For example, the first semiconductor chip 230 and one second semiconductor chip 240 of the semiconductor package 2, and one wiring interposer 302 disposed between the first semiconductor chip 230 and the one second semiconductor chip 240, may correspond to the first semiconductor chip 210, the second semiconductor chip 220, and the wiring interposer 300 of the semiconductor package 1 of FIGS. 4A through 4C. An adhesion material layer 410 formed between the first semiconductor chip 230 and the one second semiconductor chip 240 may correspond to the adhesion material layer 400 of FIGS. 4A through 4C.

In exemplary embodiments, the number of wiring interposers 302 of the semiconductor package 2 may be equal to the number of second semiconductor chips 240. However, the inventive concept is not limited thereto. For example, in exemplary embodiments, one wiring interposer 302 may be disposed between two or more second semiconductor chips 240 that are adjacent to one side of the first semiconductor chip 230, or two or more wiring interposers 302 may be disposed between the first semiconductor chip 230 and one second semiconductor chip 240.

The adhesion material layer 410 may fill the accommodation cavity 150 and surround bottom and side surfaces of the wiring interposers 302. A part of the first semiconductor chip 230 and a part of one second semiconductor chip 240 may overlap the one wiring interposer 302 corresponding to the first semiconductor chip 230 and the one second semiconductor chip 240. A first extension adhesion layer 412 and a second extension adhesion layer 414 of the adhesion material layer 410 that extend from both sides of the wiring interposer 302 along a region between the first semiconductor chip 230 and the one second semiconductor chip 240 may have symmetrical shapes with respect to the wiring interposer 302. The first extension adhesion layer 412 and the second extension adhesion layer 414 may be parts of the adhesion material layer 410 formed in the first spacing groove 160 and the second spacing groove 170, respectively.

The first extension adhesion layer 412 may extend in a direction in which the other second semiconductor chips 240 are not disposed. The second extension adhesion layer 414 may extend in a direction in which the other second semiconductor chips 240 are disposed.

Figure 9:
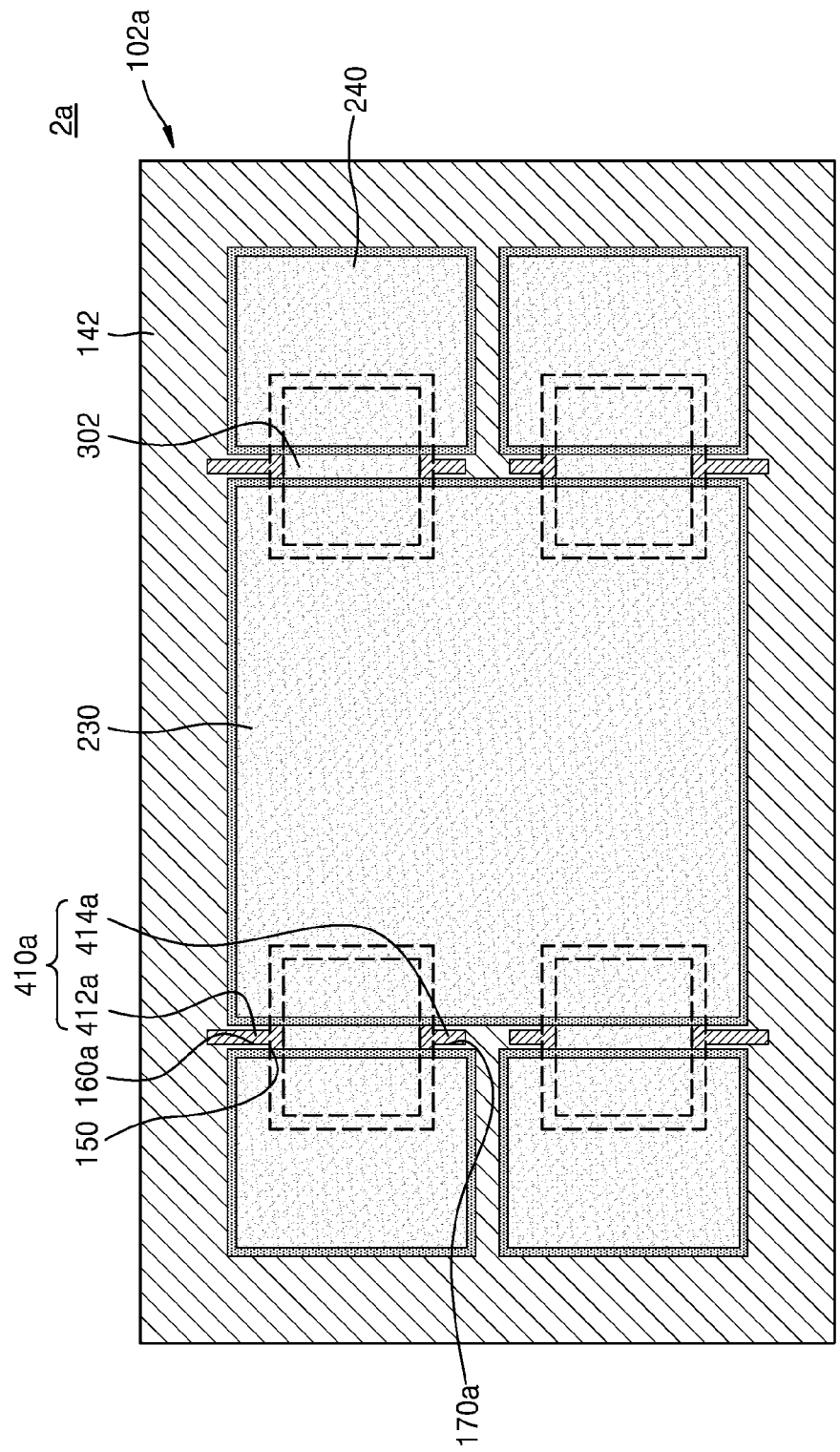

Referring to FIG. 9, in an exemplary embodiment, the semiconductor package 2a may include a PCB 102a, the first semiconductor chip 230, the plurality of second semiconductor chips 240, and the plurality of wiring interposers 302. An adhesion material layer 410a may be formed between the first semiconductor chip 230 and one second semiconductor chip 240.

The adhesion material layer 410a may include a first extension adhesion layer 412a formed in the first spacing groove 160a and a second extension adhesion layer 414a formed in the second spacing groove 170a. The first spacing groove 160a and the second spacing groove 170a may have asymmetrical shapes with respect to the accommodation cavity 150. For example, the first spacing groove 160a may extend from the accommodation cavity relatively more than the second spacing groove 170a (e.g., the length of the first spacing groove 160a may be larger than the length of the second spacing groove 170a).

Thus, the first extension adhesion layer 412a and the second extension adhesion layer 414a of the adhesion material layer 410a formed in the semiconductor package 2a may have asymmetrical shapes with respect to the wiring interposer 302. For example, the first extension adhesion layer 412a may extend more than the second extension adhesion layer 414a from the wiring interposer 302 (e.g., the length of the first extension adhesion layer 412a may be greater than the length of the second extension adhesion layer 414a). The first extension adhesion layer 412a that extends in a direction in which the other second semiconductor chips 240 are not disposed may be longer than the second extension adhesion layer 414a that extends in a direction in which the other second semiconductor chips 240 are disposed.

Figure 10:
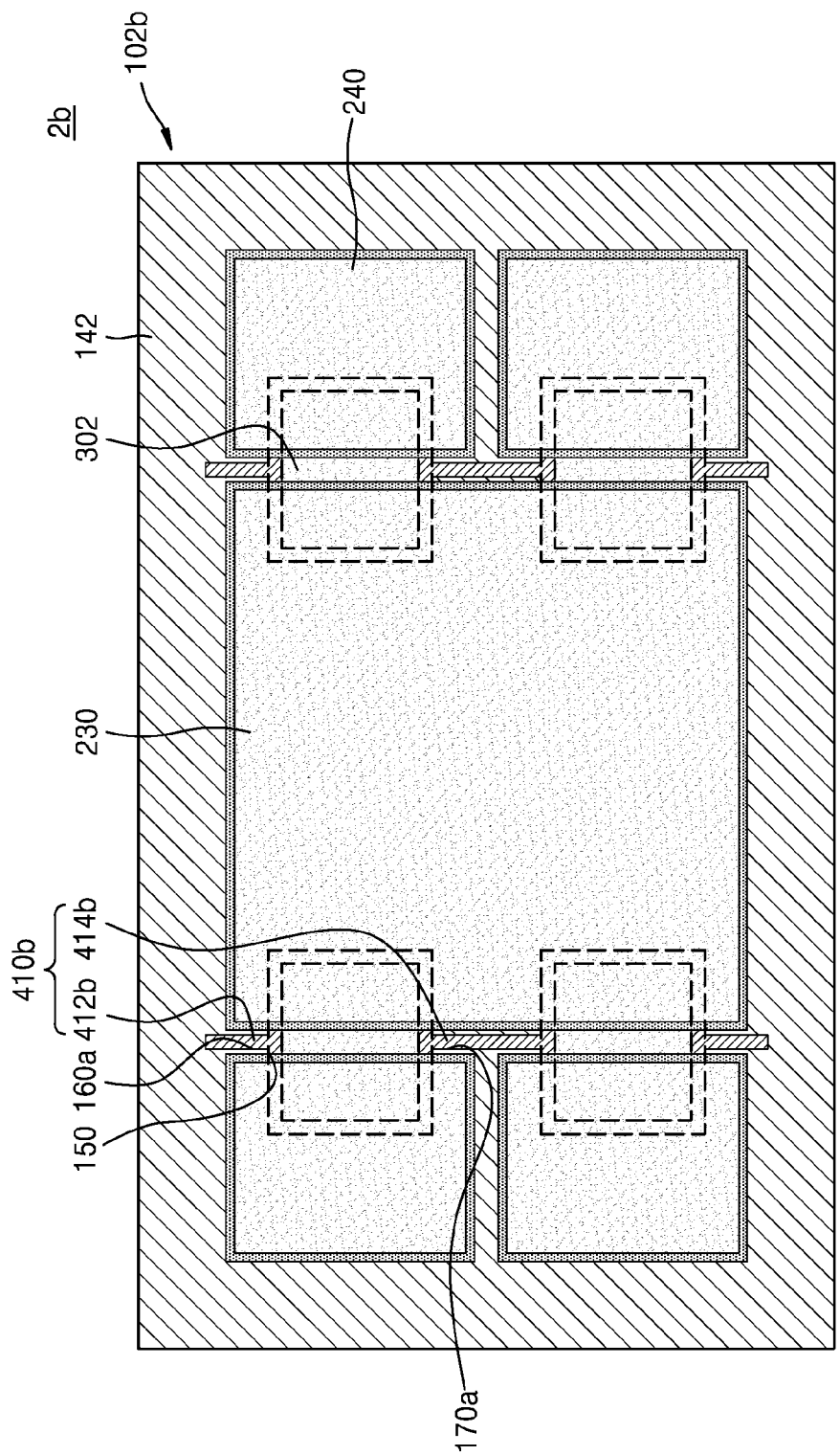

Referring to FIG. 10, in an exemplary embodiment, the semiconductor package 2b may include a PCB 102b, the first semiconductor chip 230, the plurality of second semiconductor chips 240, and the plurality of wiring interposers 302. An adhesion material layer 410b may be formed between the first semiconductor chip 230 and one second semiconductor chip 240.

The adhesion material layer 410b may include a first extension adhesion layer 412b formed in the first spacing groove 160a and a second extension adhesion layer 414b formed in the second spacing groove 170a.

The second spacing grooves 170a may extend from the accommodation cavity 150 that accommodates the two wiring interposers 302 that respectively overlap the two second semiconductor chips 240 spaced apart from each other at one side of the first semiconductor chip 230 in a direction in which the other second semiconductor chips 240 are disposed. Further, the second spacing grooves 170a may face each other, and may connect to each other. Thus, the first extension adhesion layer 412b extending in a direction in which the other second semiconductor chips 240 are not disposed may have an end portion, and the second extension adhesion layer 414b extending in the direction in which the other second semiconductor chips 240 are disposed may be connected to the other second extension adhesion layers 414a disposed between the first semiconductor chip 230 and the other second semiconductor chips 240.

Figure 11:
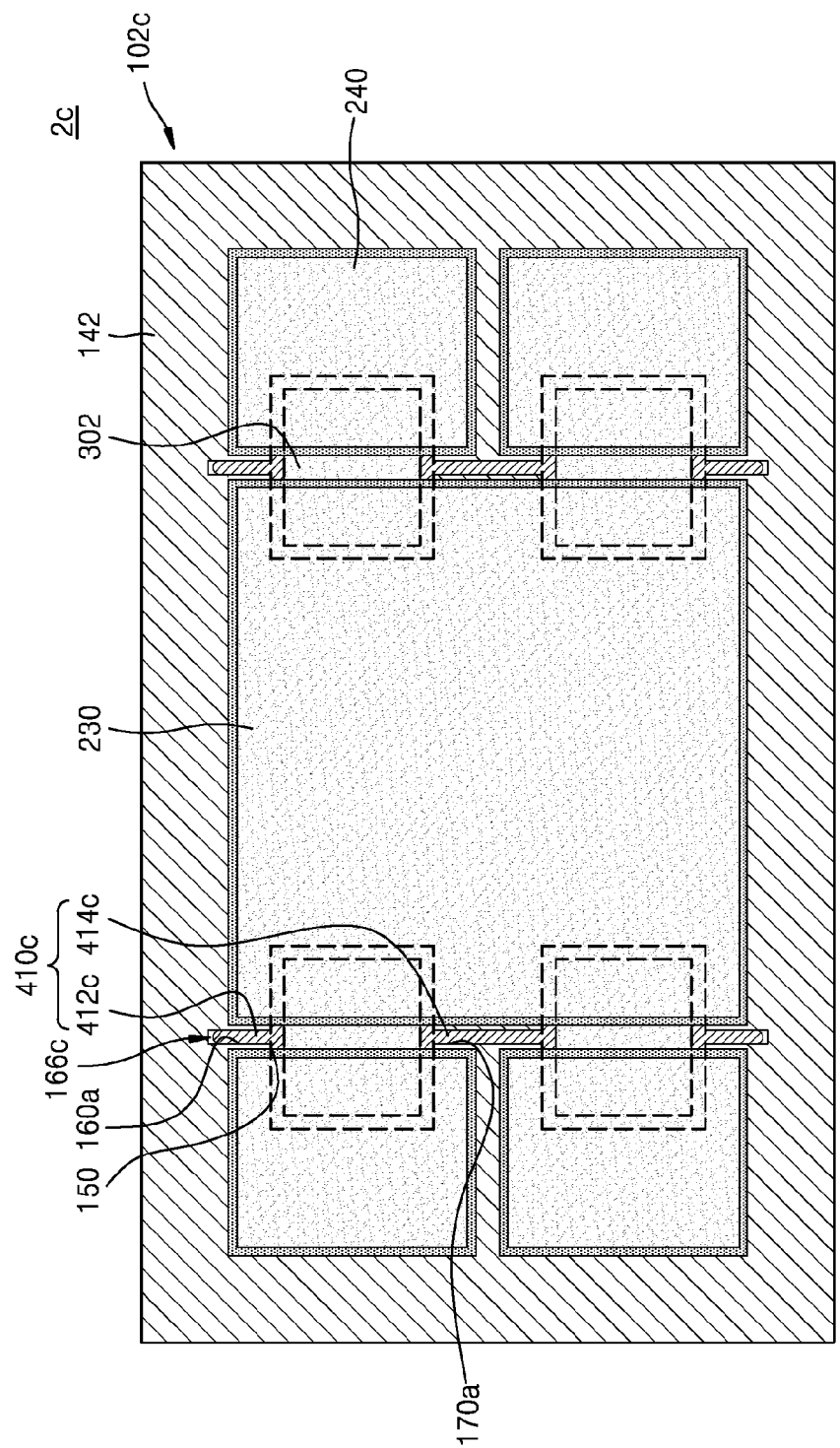

Referring to FIG. 11, in an exemplary embodiment, the semiconductor package 2c may include a PCB 102c, the first semiconductor chip 230, the plurality of second semiconductor chips 240, and the plurality of wiring interposers 302. An adhesion material layer 410c may be formed between the first semiconductor chip 230 and one second semiconductor chip 240. The adhesion material layer 410c may include a first extension adhesion layer 412c formed in the first spacing groove 160a and a second extension adhesion layer 414c formed in the second spacing groove 170a.

In an exemplary embodiment, the first extension adhesion layer 412c that is a part of the adhesion material layer 410c formed in the first spacing groove 160a does not wholly fill the first spacing groove 160a. A space 166c of the first spacing groove 160a that is not filled by the first extension adhesion layer 412c may be filled by the molding layer 600, as shown in FIG. 6C.

Figure 12:
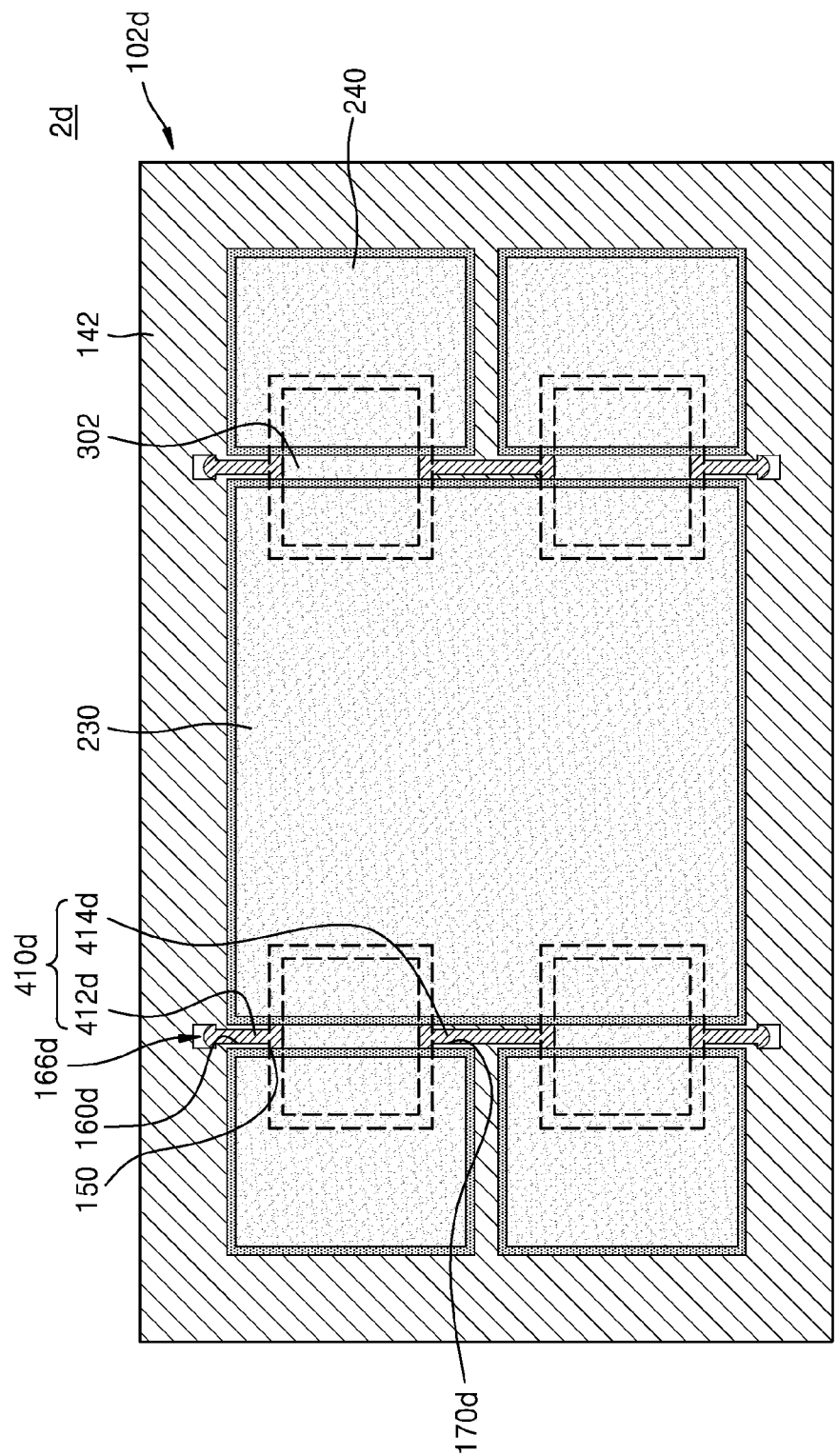

Referring to FIG. 12, in an exemplary embodiment, the semiconductor package 2d may include a PCB 102d, the first semiconductor chip 230, the plurality of second semiconductor chips 240, and the plurality of wiring interposers 302. An adhesion material layer 410d may be formed between the first semiconductor chip 230 and one second semiconductor chip 240. The adhesion material layer 410d may include a first extension adhesion layer 412d formed in the first spacing groove 160d and a second extension adhesion layer 414d formed in the second spacing groove 170d.

In an exemplary embodiment, the first extension adhesion layer 412d that is a part of the adhesion material layer 410d formed in the first spacing groove 160d does not wholly fill the first spacing groove 160d. A space 166d in the first spacing groove 160d that is not filled by the first extension adhesion layer 412d may be filled by the molding layer 600, as shown in FIG. 6C.

Figure 13:
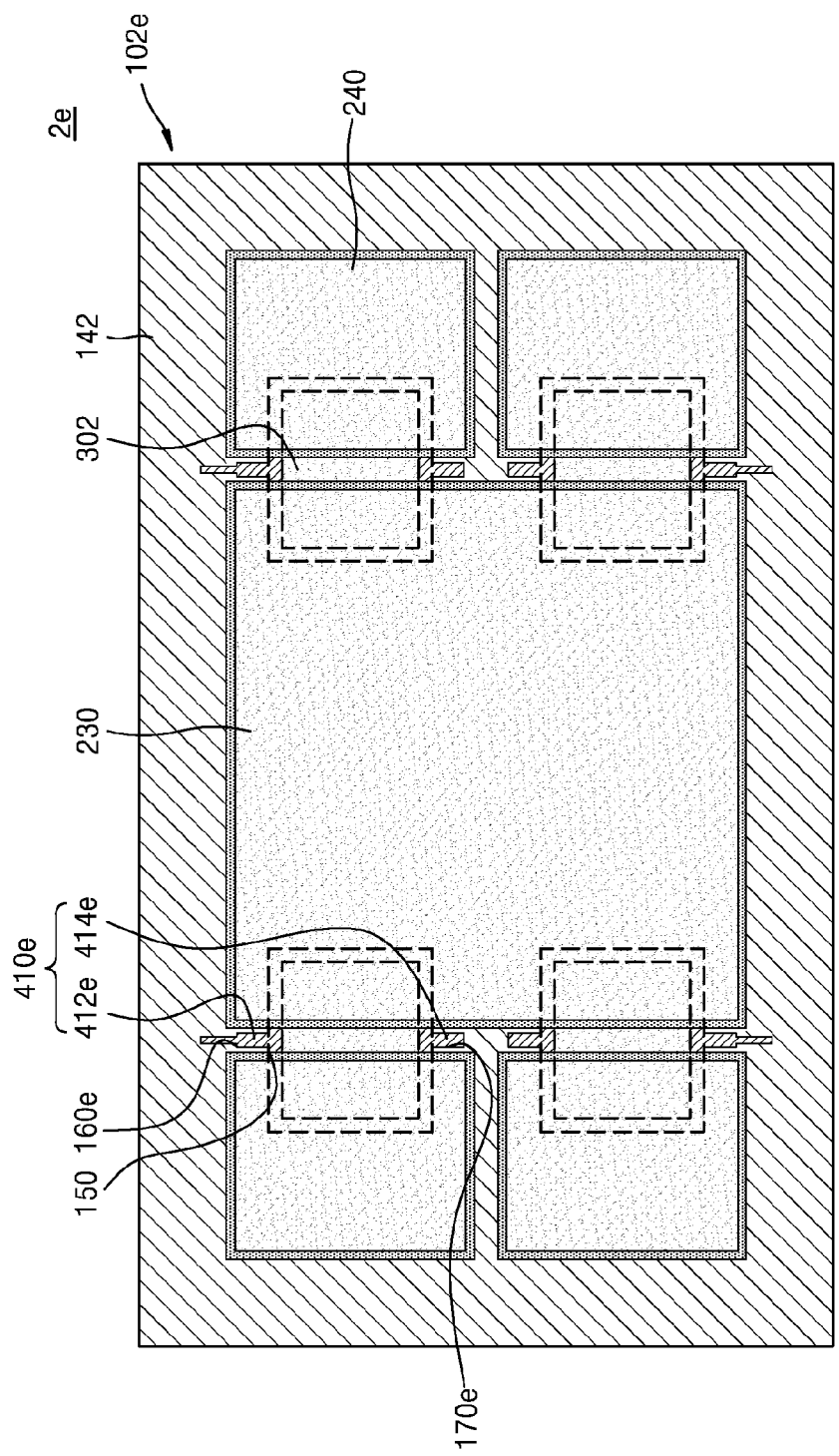

Referring to FIG. 13, the semiconductor package 2e may include a PCB 102e, the first semiconductor chip 230, the plurality of second semiconductor chips 240, and the plurality of wiring interposers 302. An adhesion material layer 410e may be formed between the first semiconductor chip 230 and one second semiconductor chip 240.

The adhesion material layer 410e may include a first extension adhesion layer 412e formed in the first spacing groove 160e and a second extension adhesion layer 414e formed in the second spacing groove 170e.

The first extension adhesion layer 412e and the second extension adhesion layer 414e of the adhesion material layer 410e formed in the semiconductor package 2e may have asymmetrical shapes with respect to the wiring interposer 302.

For example, the first extension adhesion layer 412e may extend more than the second extension adhesion layer 414e from the wiring interposer 302 (e.g., the length of the first extension adhesion layer 412e may be larger than the length of the second extension adhesion layer 414e). For example, the first extension adhesion layer 412e that extends in a direction in which the other second semiconductor chips 240 are not disposed may be longer than the second extension adhesion layer 414e that extends in a direction in which the other second semiconductor chips 240 are disposed. A width of an end portion of the first extension adhesion layer 412e may be relatively less than that of a portion thereof adjacent to the wiring interposer 302.

In exemplary embodiments, the end portion of the first extension adhesion layer 412e having the relatively small width may fill only a part of a lower side of the first spacing groove 160e. Similar to the upper side space 166e of FIG. 7B, an upper side space of the first spacing groove 160e that is not filled by the first extension adhesion layer 412e may be filled by the molding layer 600, as shown in FIG. 7B.

Figure 14:
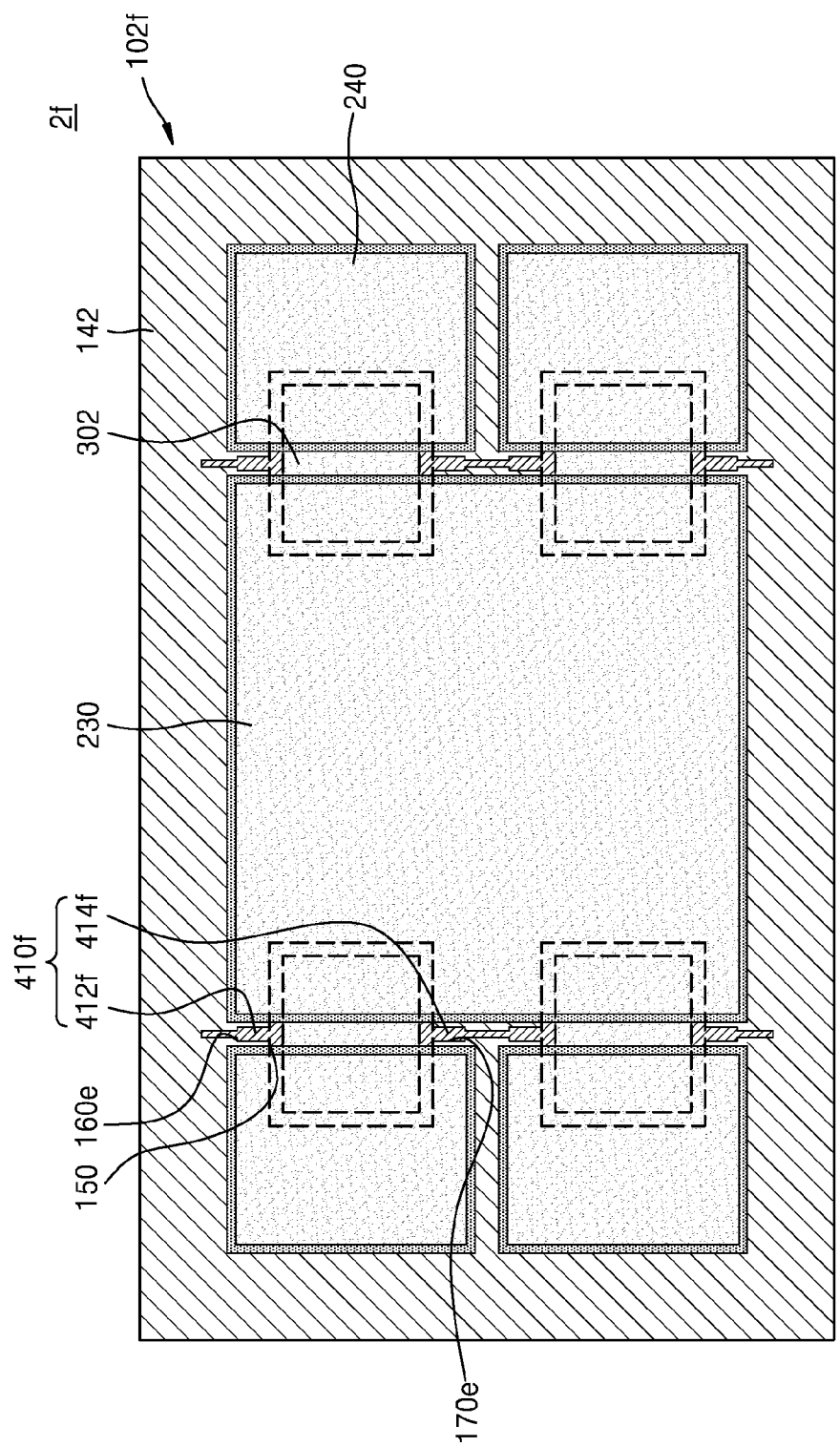

Referring to FIG. 14, the semiconductor package 2f may include a PCB 102f, the first semiconductor chip 230, the plurality of second semiconductor chips 240, and the plurality of wiring interposers 302. An adhesion material layer 410f may be formed between the first semiconductor chip 230 and one second semiconductor chip 240.

The adhesion material layer 410f may include a first extension adhesion layer 412f formed in the first spacing groove 160e and a second extension adhesion layer 414f formed in the second spacing groove 170e. A width of an end portion of each of the first extension adhesion layer 412f and the second extension adhesion layer 414f may be relatively less than that of a portion thereof adjacent to the wiring interposer 302.

The first extension adhesion layer 412f extending in a direction in which the other second semiconductor chips 240 are not disposed may have an end portion, and the second extension adhesion layer 414f extending in the direction in which the other second semiconductor chips 240 are disposed may be connected to the other second extension adhesion layers 414f disposed between the first semiconductor chip 230 and the other second semiconductor chips 240.

In exemplary embodiments, the end portions of the first extension adhesion layer 412f and the second extension adhesion layer 414f having the relatively small width may respectively fill only parts of lower sides of the first spacing groove 160e and the second spacing groove 170e. Similar to the upper side spaces 166e and 176e of FIG. 7B, upper side spaces of the first spacing groove 160e and the second spacing groove 170e that are not filled by the first extension adhesion layer 412f and the second extension adhesion layer 414f may be filled by the molding layer 600, as shown in FIG. 7B.

Figure 15:
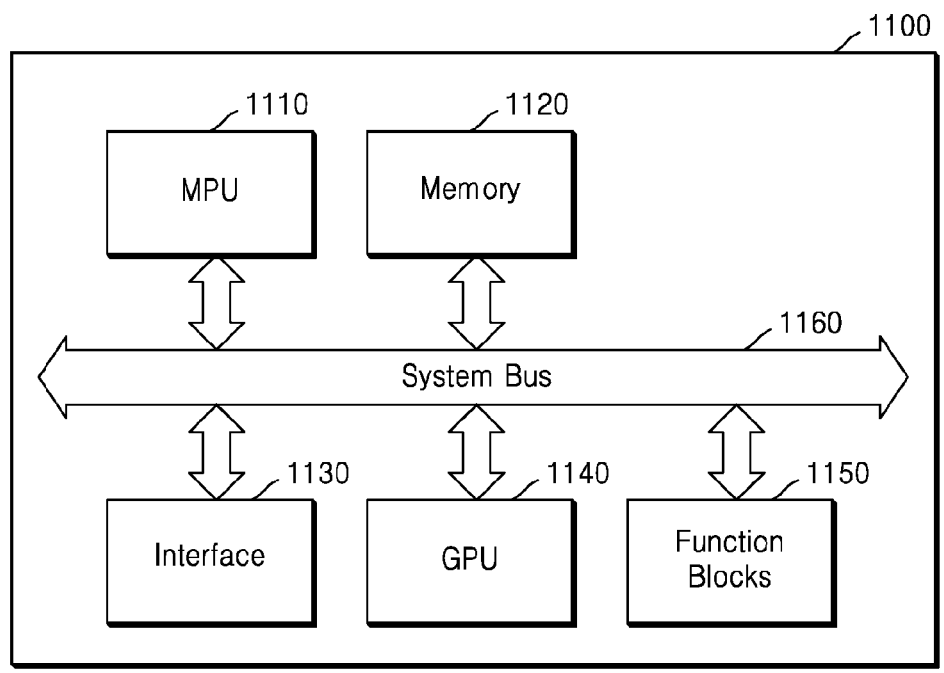
FIG. 15 is a schematic diagram of a configuration of a semiconductor package according to an exemplary embodiment of the inventive concept.

FIG. 15 is a schematic diagram of a configuration of a semiconductor package 1100 according to an exemplary embodiment of the inventive concept.

Referring to FIG. 15, the semiconductor package 1100 may include a micro processing unit (MPU) 1110, a memory 1120, an interface 1130, a GPU 1140, function blocks 1150, and a system bus 1160 via which the MPU 1110, the memory 1120, the interface 1130, the GPU 1140, and the function blocks 1150 are connected to one another. The semiconductor package 1100 may include both the MPU 1110 and the GPU 1140, or may include either the MPU 1110 or the GPU 1140.

The MPU 1110 may include a core and an L2 cache. For example, the MPU 1110 may include multi-cores. The multi-cores may have the same performance characteristics or different performance characteristics relative to one another. The multi-cores may be activated at the same time or at different points of time. The memory 1120 may store results of processes performed by the function blocks 1150 under the control of the MPU 1110. For example, as contents stored in the L2 cache of the MPU 1110 are flushed, the memory 1120 may store the results of processes performed by the function blocks 1150. The interface 1130 may interface with external devices. For example, the interface 1130 may interface with a camera, a liquid crystal display (LCD), a speaker, etc.

The GPU 1140 may perform graphic functions. For example, the GPU 1140 may perform video codec or process three-dimensional (3D) graphics.

The function blocks 1150 may perform various functions. For example, when the semiconductor package 1100 is an AP used in a mobile device, some of the function blocks 1150 may perform a communication function.

The semiconductor package 1100 may be any one of the semiconductor devices 1, 1a, 1b, 1c, 1d, 2, 2a, 2b, 2c, 2d, 2e, and 2f of FIGS. 1 through 14. The MPU 1110 and/or the GPU 1140 may be any one of the first semiconductor chips 210 and 230 of FIGS. 1A and 14. The memory 1120 may be any one of the second semiconductor chips 220 and 240 of FIGS. 1A and 14.

The interface 1130 and the function blocks 1150 may correspond to parts of the first semiconductor chips 210 and 230 of FIGS. 1A and 14.

The semiconductor package 1100 may be designed according to exemplary embodiments of the present inventive concept described herein. Thus, the semiconductor package 1100 may include the MPU 1110 and/or the GPU 1140 and the memory 1120, and may provide a reliable electrical interconnection between the MPU 1110 and/or the GPU 11140 and the memory 1120. As a result, the semiconductor package 1100 may have high capacity, high performance, and high reliability.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor package, comprising:
   a printed circuit board (PCB) comprising a substrate base, a plurality of upper pads disposed on an upper surface of the substrate base, an accommodation cavity recessed in the upper surface of the substrate base, and at least one spacing groove recessed in the upper surface of the substrate base, wherein the at least one spacing groove is connected to the accommodation cavity and extends from the accommodation cavity;
   a wiring interposer disposed in the accommodation cavity, wherein the wiring interposer comprises an interposer substrate and a plurality of connection pads disposed on the interposer substrate;
   a first semiconductor chip and a second semiconductor chip attached to the PCB and spaced apart from each other, wherein the first semiconductor chip and the second semiconductor chip comprise connection terminals connected to the plurality of upper pads and the plurality of connection pads; and
   an adhesion material layer disposed in the accommodation cavity and at least a part of the at least one spacing groove, wherein the adhesion material layer is disposed between the wiring interposer and side surfaces of the accommodation cavity, and between the wiring interposer and a lower surface of the accommodation cavity,
   wherein the upper surface of the substrate base, an upper surface of the interposer substrate, and an upper surface of the adhesion material layer are substantially aligned with one another at a same level.

2. The semiconductor package of claim 1, wherein the first semiconductor chip and the second semiconductor chip are spaced apart from each other in a first direction, and the at least one spacing groove extends in a second direction substantially perpendicular to the first direction.

3. The semiconductor package of claim 2, wherein the at least one spacing groove comprises a first spacing groove and a second spacing groove that respectively extend from opposite sides of the accommodation cavity in the second direction,
   wherein the accommodation cavity, the first spacing groove and the second spacing groove are recessed in the upper surface of the substrate base.

4. The semiconductor package of claim 3, wherein the first spacing groove and the second spacing groove have asymmetrical shapes with respect to the accommodation cavity.

5. The semiconductor package of claim 2, further comprising:
   a molding layer covering an upper surface of the PCB, the first semiconductor chip, and the second semiconductor chip,
   wherein the molding layer is disposed in a part of an end portion of the at least one spacing groove.

6. The semiconductor package of claim 2, wherein the PCB further comprises:
   an etching stop pattern disposed on a bottom surface of each of the accommodation cavity and the at least one spacing groove,
   wherein the adhesion material layer is disposed between a bottom surface of the wiring interposer and the etching stop pattern.

7. The semiconductor package of claim 1, wherein the at least one spacing groove comprises an extension portion that extends from the accommodation cavity at a uniform width, and an end portion that extends from the extension portion and has a different width than the uniform width of the extension portion.

8. The semiconductor package of claim 7, wherein the extension portion is recessed in the upper surface of the substrate base in a region between the first semiconductor chip and the second semiconductor chip.

9. The semiconductor package of claim 1, wherein at least a part of the end portion is located outside a region between the first semiconductor chip and the second semiconductor chip.

10. A semiconductor package, comprising:
    a printed circuit board (PCB) comprising a substrate base, a plurality of upper pads disposed on an upper surface of the substrate base, an accommodation cavity recessed in the upper surface of the substrate base, and at least one spacing groove recessed in the upper surface of the substrate base, wherein the at least one spacing groove is connected to the accommodation cavity;
    a wiring interposer disposed in the accommodation cavity, wherein the wiring interposer comprises an interposer substrate and a plurality of connection pads disposed on the interposer substrate;
    a first semiconductor chip and a second semiconductor chip attached to the PCB and spaced apart from each other, wherein the first semiconductor chip and the second semiconductor chip comprise connection terminals connected to the plurality of upper pads and the plurality of connection pads; and
    an adhesion material layer filling the accommodation cavity and at least a part of the at least one spacing groove, wherein the adhesion material layer surrounds side surfaces of the wiring interposer and a bottom surface of the wiring interposer,
    wherein the upper surface of the substrate base, an upper surface of the interposer substrate, and an upper surface of the adhesion material layer are disposed at a same level as one another.

11. The semiconductor package of claim 10, wherein the first semiconductor chip overlaps a first portion of the accommodation cavity, the second semiconductor chip overlaps a second portion of the accommodation cavity, and the first semiconductor chip and the second semiconductor chip do not overlap a third portion of the accommodation cavity disposed between the first and second portions.

12. The semiconductor package of claim 11, wherein the first semiconductor chip and the second semiconductor chip are spaced apart from each other in a first direction, and the at least one spacing groove extends in a second direction substantially perpendicular to the first direction.

* * * * *